(12) United States Patent
Takahashi et al.

(10) Patent No.: US 10,720,203 B2
(45) Date of Patent: Jul. 21, 2020

(54) SEMICONDUCTOR DEVICE INCLUDING SENSE AMPLIFIER CONTORL CIRCUIT

(71) Applicant: RENESAS ELECTRONICS CORPORATION, Tokyo (JP)

(72) Inventors: Hiroyuki Takahashi, Tokyo (JP); Masahiro Yoshida, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/152,103

(22) Filed: Oct. 4, 2018

(65) Prior Publication Data

US 2019/0164591 A1 May 30, 2019

(30) Foreign Application Priority Data

Nov. 28, 2017 (JP) .................. 2017-227790

(51) Int. Cl.
*G11C 11/4091* (2006.01)
*G11C 11/4076* (2006.01)
(Continued)

(52) U.S. Cl.
CPC ...... *G11C 11/4091* (2013.01); *G11C 11/4076* (2013.01); *G11C 11/4082* (2013.01); *G11C 11/4093* (2013.01); *G11C 11/4096* (2013.01); *G11C 11/4097* (2013.01); *G11C 11/4099* (2013.01); *G11C 11/40607* (2013.01); *G11C 7/08* (2013.01); *G11C 11/4087* (2013.01); *G11C 11/4094* (2013.01)

(58) Field of Classification Search
CPC .............. G11C 11/401; G11C 11/4091; G11C 11/40607; G11C 11/4076; G11C 11/4082; G11C 11/4093; G11C 11/4096; G11C 11/4099; G11C 11/4087; G11C 11/4094
See application file for complete search history.

(56) References Cited

U.S. PATENT DOCUMENTS 5,453,951 A * 9/1995 Proebsting ............ G11C 7/1048
365/181
6,041,004 A * 3/2000 Haga ..................... G11C 7/06
365/189.16
(Continued)

FOREIGN PATENT DOCUMENTS

JP 10-162577 A 6/1998

*Primary Examiner* — Alfredo Bermudez Lozada
(74) *Attorney, Agent, or Firm* — McDermott Will & Emery LLP

(57) ABSTRACT

A semiconductor device is provided that operates at improved write speeds without an increase in area. The semiconductor device according to the invention includes a plurality of memory cells arranged in a matrix of rows and columns, a plurality of word lines provided to each row of the memory cells, a plurality of bit line pairs provided to each column of the memory cells, sense amplifiers that amplify the potential difference in the bit line pairs, data line pairs that transfer data to the bit line pairs, column selection circuits that permit receiving the data from the data line pairs, a column decoder that transmits column selection signals to the column selection circuits, and a sense amplifier control circuit that activates the sense amplifiers after the column decoder transmits the column selection signals to the column selection circuits.

14 Claims, 16 Drawing Sheets

(51) Int. Cl.
*G11C 11/4093* (2006.01)
*G11C 11/4096* (2006.01)
*G11C 11/406* (2006.01)
*G11C 11/4099* (2006.01)
*G11C 11/408* (2006.01)
*G11C 11/4097* (2006.01)
G11C 11/4094 (2006.01)
G11C 7/08 (2006.01)

(56) References Cited

U.S. PATENT DOCUMENTS

2004/0027898 A1* 2/2004 Takahashi .............. G11C 29/12
    365/222
2014/0133251 A1* 5/2014 Takahashi ................ G11C 7/08
    365/189.16

\* cited by examiner

SEMICONDUCTOR DEVICE INCLUDING SENSE AMPLIFIER CONTORL CIRCUIT

CROSS REFERENCE TO RELATED APPLICATIONS

The disclosure of Japanese Patent Application No. 2017-227790 filed on Nov. 28, 2017 including the specification, drawings and abstract is incorporated herein by reference in its entirety.

BACKGROUND

This invention relates to semiconductor devices, and, for example, to a semiconductor device with improved write speeds.

Various proposals to increase the speed of storage devices, such as dynamic random access memory (DRAM), have been made. For instance, Japanese Unexamined Patent Application Publication No. Hei 10(1998)-162577 describes a technique of sequentially writing data into memory cells in different columns to perform the write operation at higher speeds.

The publication discloses a semiconductor device including a sense amplifier control circuit that activates a sense amplifier in a column selected by a column selection gate independently of sense amplifiers in the other columns in a memory cell array. The activation of the sense amplifier in the selected column is performed at the same time as, or after, the selection of the column by the column selection gate.

SUMMARY

However, the related art described in the aforementioned publication requires individual activation of sense amplifiers for every selected column. Such a semiconductor device requires a separate sense amplifier control circuit for every column and a signal line for every sense amplifier control circuit. As a result, the area of the semiconductor device becomes large.

Other problems and novel features will become apparent from the following description in the specification and the accompanying drawings.

According to an embodiment, the semiconductor device includes a plurality of memory cells arranged in a matrix of rows and columns, a plurality of word lines provided to each row of the memory cells, a plurality of pairs of bit lines provided to each column of the memory cells, sense amplifiers that amplify the potential difference between the pairs of bit lines, data line pairs that transfer data to the pairs of bit lines, column selection circuits that permit the pairs of bit lines and the data line pairs to connect to each other, a column decoder that transmits column selection signals to the column selection circuits, and a sense amplifier control circuit that activates the sense amplifiers after the column decoder transmits the column selection signals to the column selection circuits.

This embodiment can provide a semiconductor device with improved write speeds without increasing the area thereof.

DETAILED DESCRIPTION

Figure 1:
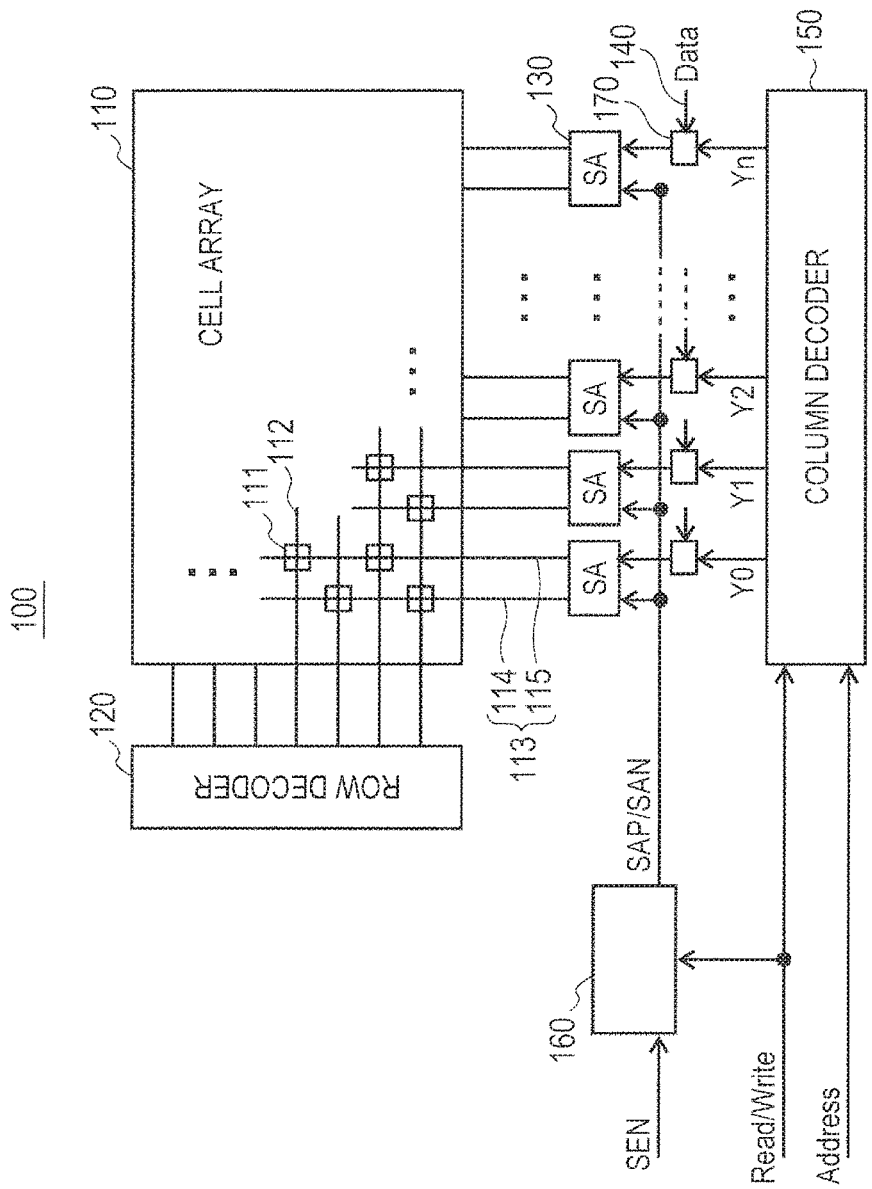
FIG. 1 is a block diagram of a semiconductor device according to the first embodiment.

With reference to the accompanying drawings, embodiments will be described below. Note that the drawings are presented in simplified form, and the technical scope of the embodiments should not be interpreted to be limited to the drawings. The same elements are denoted by the same reference numerals, and a duplicate description is omitted.

The following description may be divided into a plurality of sections or embodiments if necessary for the sake of convenience; however, these sections or embodiments are not irrelevant to each other unless otherwise stated, and one is related to the modifications, the details, the supplementary explanation, or the like of part, or all of the other. Also, in the embodiments below, the number of components (including number, numerical value, amount, range, etc.) is not limited to the particular number unless explicitly specified or specifically being limited to the particular number in principle, and may be more than or less than the described number.

Furthermore, in the embodiments below, it is a matter of course that the components (including the operational steps) are not necessarily essential unless explicitly stated or clearly considered necessary in principle. Similarly, in the embodiments below, the shape, positional relation, and the like of the components include substantially the same or similar shape and the like unless explicitly stated or clearly considered inappropriate in principle. This is also applied to the number (number, numerical value, amount, range, etc.).

The following description and the drawings are appropriately omitted and simplified for clarifying the explanations. The components represented in the drawings as functional blocks which perform various types of processing are implemented by hardware, such as a central processing unit (CPU), a memory, and other forms of circuitry, or by software, such as a program loaded on a memory. Therefore, it will be obvious to those skilled in the art that the functional blocks can be implemented in a variety of manners, for example, by only hardware, by only software, or by a combination thereof, and the manners are not limited to one of them. Through all the drawings, like components are denoted by like numerals, and the explanations thereof will not be repeated on an as-needed basis.

In the following description, the phrase "a signal is at an H level" means that the signal is at a high level. The phrase "a signal is at a high level" means, for example, that the signal voltage is a supply voltage VDD. On the contrary, the phrase "a signal is at an L level" means that the signal is at a low level. The phrase "a signal is at a low level" means, for example, that the signal voltage is a ground voltage GND.

First Embodiment

With reference to FIG. 1, the configuration of the first embodiment will be described below. FIG. 1 is a block diagram of a semiconductor device according to the first embodiment.

The semiconductor device 100 shown in FIG. 1 is a DRAM device. The DRAM device is a device for storing data into a memory cell and for reading data out of the memory cell by selecting a word line and a pair of bit lines associated with the memory cell. The semiconductor device 100 at least includes a cell array 110, a row decoder 120, sense amplifiers 130, a column decoder 150, and a sense amplifier control circuit 160 as main components.

The cell array 110 at least includes a plurality of memory cells 111 arranged in a matrix of rows and columns, a plurality of word lines 112 provided for each row of the memory cells 111, and a plurality of pair of bit lines 113 provided for each column of the memory cells 111. The memory cells 111 are DRAM memory cells arranged in association with the word lines and bit lines. Specifically, each of the memory cells 111 includes a transistor that receives gate signals from a word line 112, and a capacitor that stores charge received from a bit line 113.

Each of the word lines 112 is provided for one of the rows of the memory cells 111 arranged in a matrix. The word lines 112 are coupled to the row decoder 120, and output selection signals from the row decoder 120 to the memory cells 111.

Each of the pairs of bit lines 113 includes a bit line 114 and a bit line 115. In this description, one of the bit lines making up a pair of bit lines is referred to as a first bit line that is used to transmit data to an addressed memory cell 111, while the other bit line is referred to as a second bit line that is used to compare the potential difference with the first bit line. The memory cells 111 coupled to the first bit lines are selected by active word lines 112, while the memory cells 111 coupled to the second bit lines are not selected by word lines 112.

The sense amplifiers 130 are circuits for amplifying the potential difference between the pairs of bit lines 113, respectively. As shown in FIG. 1, the semiconductor device 100 has a plurality of the sense amplifiers 130 associated with a plurality of the pairs of bit lines 113. The sense amplifiers 130 are coupled to the pairs of bit lines 113, respectively. In addition, the sense amplifiers 130 are coupled to the sense amplifier control circuit 160 and receive activation signals SAP and SAN from the sense amplifier control circuit 160. In response to the activation signals SAP and SAN the sense amplifiers 130 amplify the potential difference between the pairs of bit lines 113, respectively.

Each of the sense amplifiers 130 is provided with a column selection circuit 170. The column selection circuits 170 receive column selection signals (Y0 to Yn), respectively, from the column decoder 150. In addition, the sense amplifiers 130 are coupled to data line pairs 140 via the column selection circuits 170. Of the sense amplifiers 130, a sense amplifier 130 associated with a column selection circuit 170 that has received a column selection signal is connected to the associated data line pair 140 to receive data from the data line pair 140.

The column decoder 150 receives an address signal (Address) together with a read command signal (Read) or a write command signal (Write) from an external device, generates column selection signals (Y0 to Yn) based on the received address signal, and outputs the column selection signals to the column selection circuits 170 individually. The column decoder 150 also can output serial column selection signals generated based on the command signals and the address signals.

The sense amplifier control circuit 160 activates the sense amplifiers 130. Specifically, upon receipt of an enable signal SEN to enable the sense amplifiers from an external device, the sense amplifier control circuit 160 outputs activation signals SAP and SAN to the sense amplifiers 130 in accordance with the received enable signal SEN. In addition, the sense amplifier control circuit 160 of the first embodiment receives a read command signal or a write command signal from an external device, and adjusts the output timing of the activation signals SAP and SAN in accordance with the received command signal.

Figure 2:
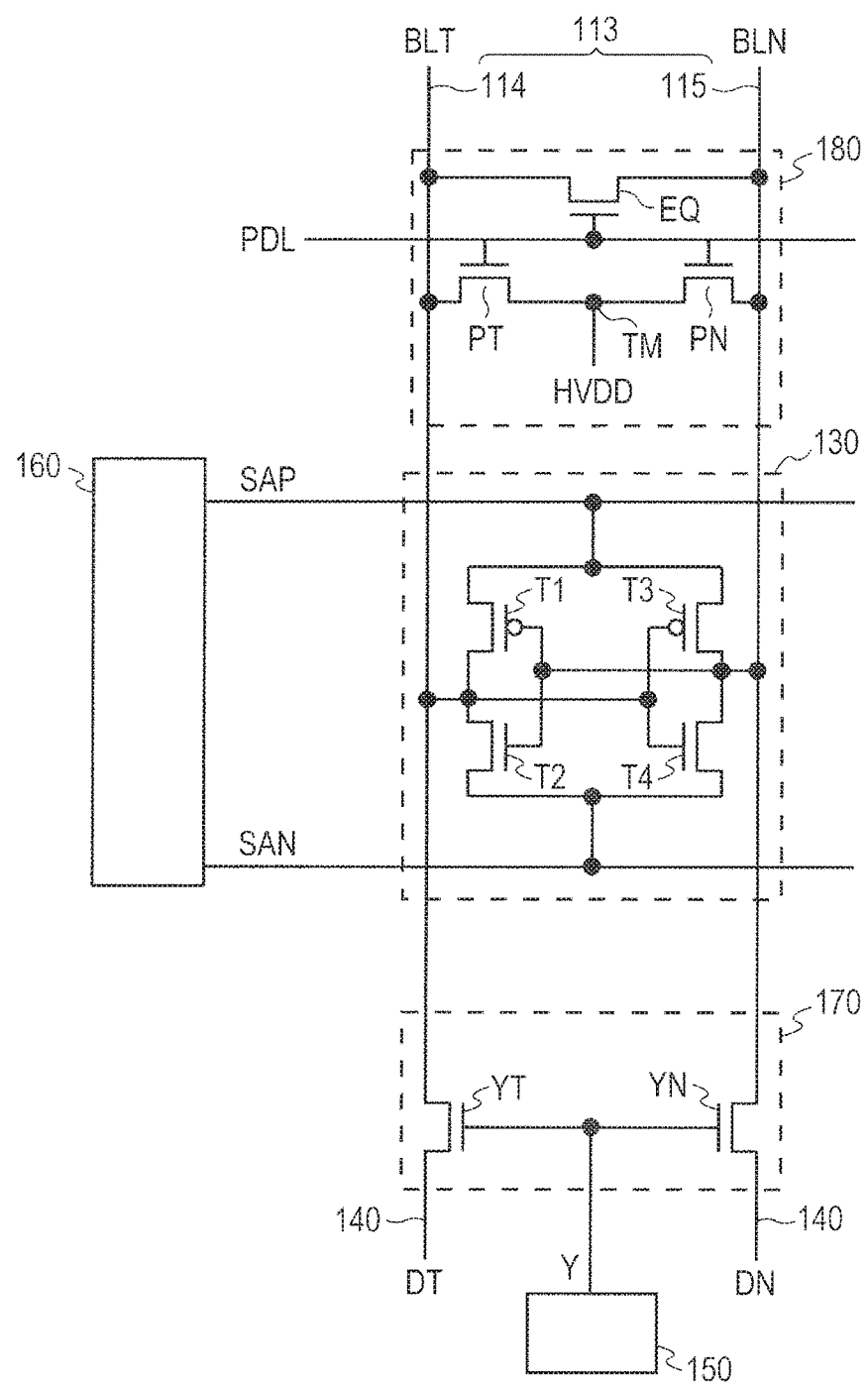
FIG. 2 is a circuit diagram of a sense amplifier and its periphery in the semiconductor device according to the first embodiment.

With referring to FIG. 2, a sense amplifier 130 and its peripheral circuits will be described. FIG. 2 is a circuit diagram of a sense amplifier 130 and its periphery in the semiconductor device according to the first embodiment. In the circuit diagram shown in FIG. 2, a sense amplifier 130, a column selection circuit 170, a precharge circuit 180, and a data line pair 140 are coupled to a pair of bit lines 113. Note that the first bit line 114 of the pair of bit lines 113 is sometimes referred to as a BLT. Similarly, the second bit line 115 is sometimes referred to as a BLN.

The precharge circuit 180 precharges the pair of bit lines 113 to a preset voltage. The preset voltage is, for example, an intermediate voltage HVDD with respect to the supply voltage VDD for the semiconductor device 100. The precharge circuit 180 includes transistors PT, PN, EQ. The transistor PT is arranged between the bit line BLT and a supply voltage terminal TM. The transistor PN is arranged between the bit line BLN and the supply voltage terminal TM. The transistor EQ is arranged between the bit line BLT and bit line BLN. The transistors PT, PN, EQ are N-type metal-oxide-semiconductor field-effect transistors (MOSFETs). A precharge signal PDL is supplied to the transistors PT, PN, EQ. An H-level precharge signal PDL turns on all the transistors PT, PN, EQ. Because all the transistors are turned on, both the bit lines of the pair of bit lines 113 are precharged to the intermediate voltage HVDD. On the other hand, an L-level precharge signal PDL turns off all the transistors PT, PN, EQ. Because all the transistors are turned off, neither of the bit lines of the pair of bit lines 113 is precharged.

The sense amplifier 130 is a circuit for amplifying the potential difference in the pair of bit lines 113, more specifically, the potential difference between the bit line BLT and bit line BLN. The sense amplifier 130 includes transistors T1 to T4. The transistors T1 and T3 are P-type MOSFETs, while the transistors T2 and T4 are N-type MOSFETs. The activation signal SAP is fed from the sense amplifier control circuit 160 to the sources of the transistors T1 and T3. The gate of the transistor T1 is coupled to the drain of the transistor T3, the bit line BLN, the source of the transistor T4, and the gate of the transistor T2. The gate of the transistor T3 is coupled to the drain of the transistor T1, the bit line BLT, the source of the transistor T2, and the gate of the transistor T4. The activation signal SAN is fed from the sense amplifier control circuit 160 to the drains of the transistors T2 and T4.

The column selection circuit 170 is a circuit that connects the pair of bit lines 113 to the data line pair 140 or disconnects the bit line pair 113 from the data line pair 140 in accordance with a signal supplied from the column decoder 150. The column selection circuit 170 has column selection gates YT and YN. Both the column selection gates YT and YN are N-type MOSFETs. A column selection signal Y is fed from the column decoder 150 to the column selection gates YT and YN. If an H-level signal is supplied as a column selection signal Y from the column decoder 150, the column selection circuit 170 connects the data line DT to the bit line BLT and connects the data line DN to the bit line BLN. On the other hand, if an L-level signal is supplied as a column selection signal Y from the column decoder 150, the column selection circuit 170 disconnects the data line DT from the bit line BLT and disconnects the data line DN from the bit line BLN.

To write data into a memory cell 111, for example, the data line pair 140 transfers the data supplied from a data output circuit (not shown) to the pair of bit lines 113. On the other hand, to read data out from a memory cell 111, for example, the data line pair 140 transfers the data from the pair of bit lines 113 to an external device.

Figure 3:
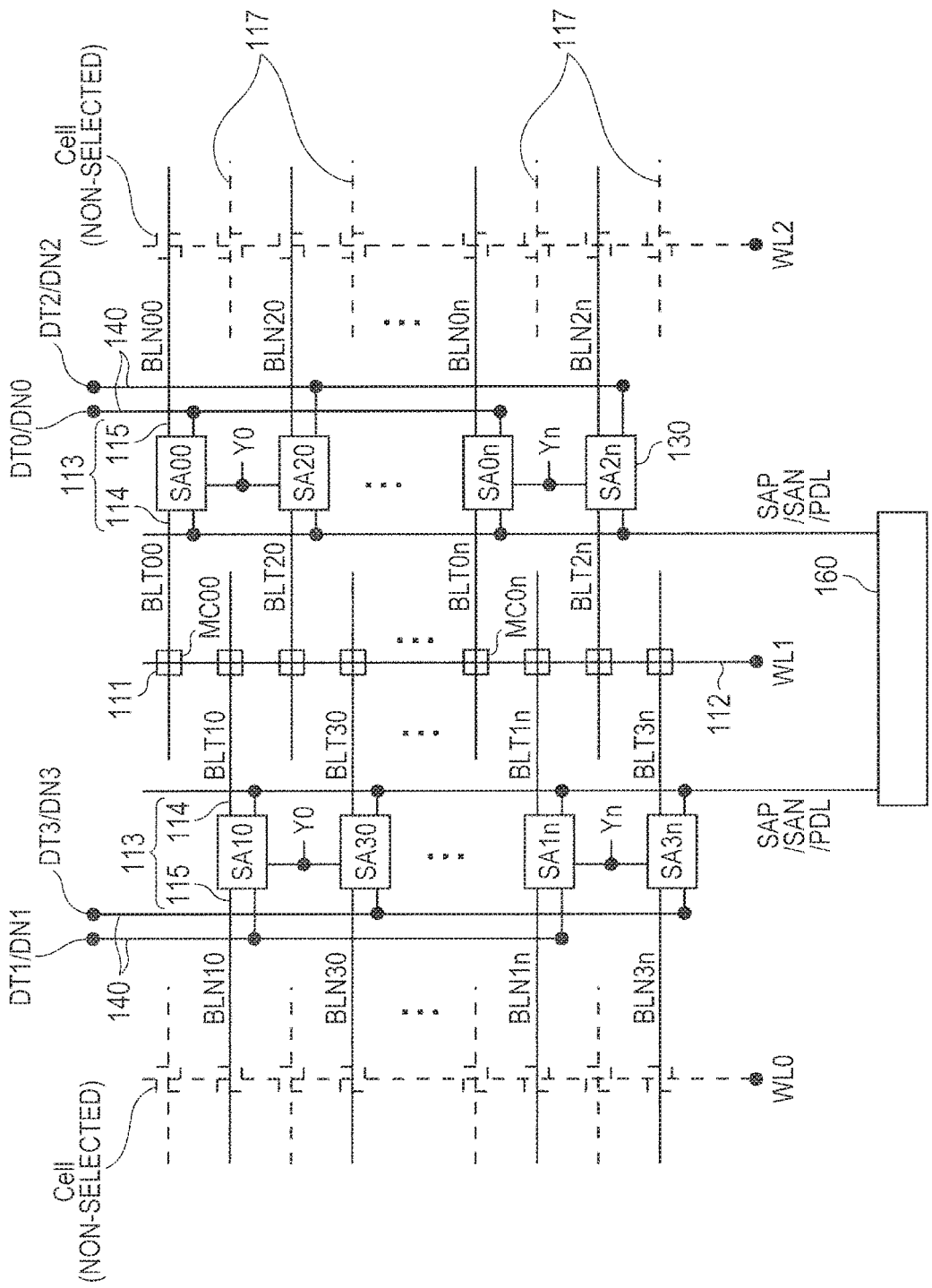
FIG. 3 is a circuit diagram of a sub-array in the semiconductor device according to the first embodiment.

Next, with reference to FIG. 3, an example of sub-arrays in a cell array will be described. FIG. 3 is a circuit diagram of a sub-array in the semiconductor device according to the first embodiment. The sub-array 116 shown in FIG. 3 includes a plurality of the memory cells 111, the word lines 112, the pairs of bit lines 113, and the sense amplifiers 130 that were described by referring to FIG. 1.

The memory cells 111 are arranged in a matrix, and the memory cells 111 are coupled to the word lines 112 (WL0 to WL1), which are represented by vertical lines in FIG. 3. In addition, the memory cells 111 are coupled to either one of the first bit lines 114 and the second bit lines 115 of the pairs of bit lines 113, which are represented by horizontal lines in FIG. 3.

In a pair of bit lines 113, a bit line coupled to the memory cells 111 selected by the word line 112 is a first bit line 114. Of the word lines 112 shown in FIG. 3, a word line WL1 is activated. Therefore, bit lines BLT00 to BLT30 and BLT0n to BLT3n coupled to the memory cells 111 associated with the word line WL1 are the first bit lines 114. On the other hand, word lines WL0 and WL2 in the word lines 112 in FIG. 3 are not selected. Therefore, bit lines BLN00 to BLN30 and BLN0n to BLN3n coupled to the memory cells 111 associated with the word lines WL0 and WL2 are the second bit lines 115.

Between the bit line BLN00 and bit line BLN20 that intersect with the unselected word line WL2 provided is a bit line 117. In the same way, a bit line 117 is provided between the bit line BLN0n and bit line BLN2n. The bit lines 117 are bit lines corresponding to unselected columns. Thus, the second bit lines 115 are adjacent to the bit lines corresponding to unselected columns.

As described above, one of the bit lines in a pair of bit lines that is coupled to a memory cell selected by a word line 112 is a first bit line. The other bit line that is coupled to a sense amplifier 130 associated with the first bit line and is used to compare the potential difference with the first bit line is a second bit line. The first bit line and second bit line of a pair of bit lines are interchangeable by changing the activation status of the word line 112.

A single sense amplifier 130 is coupled to a single pair of bit lines 113, more specifically, coupled to a first bit line 114 and a second bit line 115. For instance, the sense amplifier SA00 in FIG. 3 is coupled to the first bit line BLT00 and the second bit line BLN00.

A single sense amplifier 130 is also coupled to a single data line pair 140. For instance, the sense amplifier SA00 in FIG. 3 receives data DT0 and DN0 from the data line pair 140. In addition, the sense amplifier 130 receives a column selection signal fed from the column decoder 150. For instance, when the sense amplifier SA00 receives a column selection signal Y0, the column selection gates are turned on. The on-state column selection gates connect the data line pair DT0/DN0 to the pair of bit lines BLT00/BLN00. Alternatively, a plurality of the sense amplifiers 130 are coupled to a single common data line pair 140. In FIG. 3, for example, the sense amplifiers SA00 to SA0n are selected by different column selection signals Y0 to Yn, and the selected sense amplifiers are coupled to the data line pair DT0/DN0.

The sense amplifiers 130 are also coupled to the sense amplifier control circuit 160 to receive SAP, SAN, PDL which are activation signals or deactivation signals. When a sense amplifier 130 receives an activation signal from the sense amplifier control circuit 160, the sense amplifier 130 amplifies the potential difference between the pair of bit lines coupled to the sense amplifier 130.

The sub-array 116 shown in FIG. 3 is configured to select four columns with a single column selection signal. In other words, the column decoder 150 outputs a single column selection signal to four column selection gates (not shown). In short, four bits of data are handled. For instance, the column selection signal Y0 is output to the column selection gates associated with the pair of bit lines of BLT00 and BLN00, the pair of bit lines of BLT10 and BLN10, the pair of bit lines of BLT20 and BLN20, and the pair of bit lines of BLT30 and BLN30. Similarly, the column selection signal Yn is output to the column selection gates associated with the pair of bit lines of BLT0n and BLN0n, the pair of bit lines of BLT1n and BLN1n, the pair of bit lines of BLT2n and BLN2n, and the pair of bit lines of BLT3n and BLN3n.

The cell array 110 is configured to include a plurality of the sub-arrays 116 as shown in FIG. 3. In summary, the semiconductor device 100 includes a plurality of sub-arrays 116 each having a plurality of memory cells 111, a plurality of sense amplifiers 130, and a single sense amplifier control circuit 160 coupled to the sense amplifiers 130. This configuration can prevent the area of the semiconductor device 100 from increasing.

Figure 4:
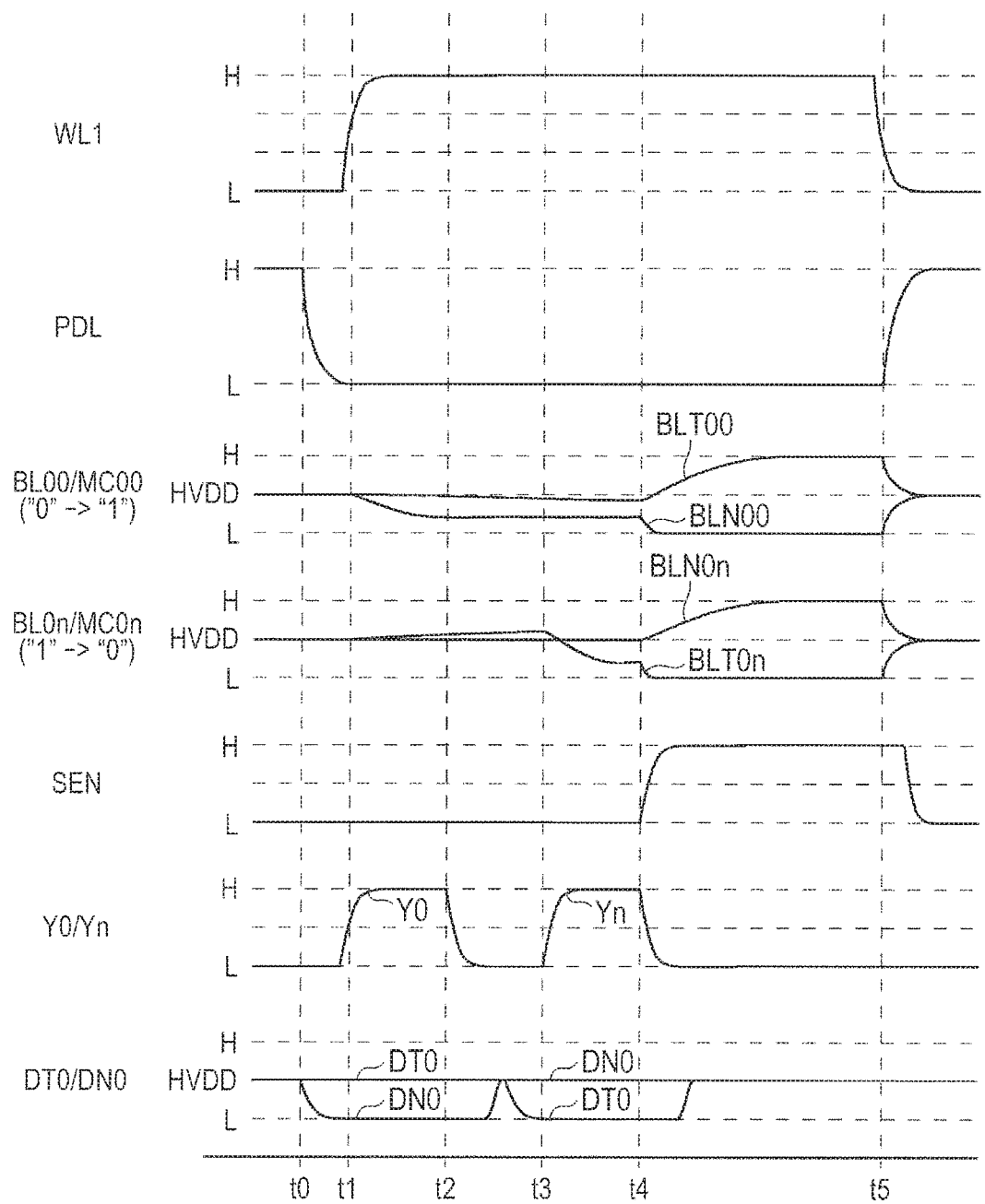
FIG. 4 is a timing diagram when the semiconductor device according to the first embodiment writes data.

Next with reference to FIG. 4, the operation of the semiconductor device 100 will be described. FIG. 4 is a timing diagram when the semiconductor device according to the first embodiment writes data. The semiconductor device according to the first embodiment sequentially selects columns. That is, the semiconductor device selects a plurality of columns by selecting a single word line. For the purpose of simplifying the description, FIG. 4 shows a case where data is written into two memory cells MC00 and MC0n, which are coupled to the word line WL1, through a common data line pair DT0/DN0 in the sub-array 116 shown in FIG. 3. The memory cell MC00 is coupled to a bit line BLT00, which is the first bit line of a pair of bit lines BL00 composed of the bit line BLT00 and a bit line BLN00. The memory cell MC0n is coupled to a bit line BLT0n, which is the first bit line in a pair of bit lines BL0n composed of the bit line BLT0n and a bit line BLN0n. The memory cell MC00 corresponds to a memory cell arranged at an intersection between the bit line BLT00 and word line WL1 in FIG. 3. Similarly, the memory cell MC0n corresponds to a memory cell arranged at an intersection between the bit line BLT0n and word line WL1 in FIG. 3.

FIG. 4 illustrates a write operation in which column selection signals Y0 and Yn are sequentially activated to write data "1" over data "0" in the memory cell MC00, while writing data "0" over data "1" in the memory cell MC0n. In the following description, writing data "0" into a memory cell denotes that the voltage of the capacitor in the memory cell is changed to an L level. Also, in the following description, writing data "1" into a memory cell denotes that the voltage of the capacitor in the memory cell is changed to an H level.

First, in the initial state, the pairs of bit lines BL00 and BL0n are precharged by the precharge circuit 180 to the intermediate voltage HVDD before Time t0. The voltage of the word line WL1 is at the L level. Since the enable signal SEN for the sense amplifiers is at the L level, the sense amplifiers 130 are not activated. Both the column selection signals Y0 and Yn are at the L level. This means that the data line pair 140 and the pairs of bit lines BL00 and BL0n are all in a non-conductive state. Incidentally, both lines of the data line pair 140 are set to the intermediate voltage HVDD.

At Time t0, a precharge signal PDL makes a transition from the H level to the L level. This brings the bit lines BLT00, BLN00, BLT0n, and BLN0n into a floating state. Also at Time t0, the voltage level of the data line DN0 of the data line pair 140 is changed to the L level.

Then, at Time t1, the voltage of the word line WL1 is changed from the L level to the H level. Changing the voltage of the word line WL1 to the H level changes the potential of the respective bit lines in accordance with the data stored in the memory cells MC00 and MC0n. In addition, the column selection signal Y0 makes a transition from the L level to the H level. The H-level column selection signal Y0 turns on the column selection gate associated with the memory cell MC00. Therefore, the data line DT0 is connected to the bit line BLT00, and the data line DN0 is concurrently connected to the bit line BLN00. In other words, the bit line BLN00 at the intermediate voltage HVDD is connected to the L-level data line DN0. This connection induces charge sharing that causes the voltage of the bit line BLN00 to start decreasing. On the other hand, the bit line BLT00 at the intermediate voltage HVDD is connected to the data line DT0 at the intermediate voltage HVDD. Because of this, the voltage of the bit line BLT00 is maintained at the intermediate voltage HVDD.

In addition, since the memory cell MC0n retains data "1", changing the voltage of the word line WL1 to the H level gradually raises the voltage of the bit line BLT0n coupled to the memory cell MC0n from the intermediate voltage HVDD due to charge sharing.

At Time t2, the column selection signal Y0 makes a transition from the H level to the L level. The L-level column selection signal Y0 disconnects the bit line BLN00 from the data line DN0. That is, the voltage of the bit line BLN00 stops dropping and is maintained as it is. On the other hand, the voltage of the bit line BLT00 starts gradually decreasing due to charge sharing since the associated memory cell MC00 retains data "0".

At Time t3, the column selection signal Yn makes a transition from the L level to the H level. The H-level column selection signal Yn turns on the column selection gate of the memory cell MC0n. Therefore, the data line DT0 is connected to the bit line BLT0n, and the data line DN0 is concurrently connected to the bit line BLN0n. The voltages of the data line DT0 and data line DN0 are inverted between Time t2 and Time t3. The bit line BLN0n with a voltage gradually increased from the intermediate voltage HVDD is connected to the L-level data line DT0. This connection induces charge sharing that causes the voltage of the bit line BLT0n to start decreasing. On the other hand, the bit line BLN0n at the intermediate voltage HVDD is connected to the data line DN0 at the intermediate voltage HVDD. Because of this, the voltage of the bit line BLN0n is maintained at the intermediate voltage HVDD.

At Time t4, the column selection signal Yn makes a transition from the H level to the L level. The L-level column selection signal Yn disconnects the bit line BLT0n from the data line DT0. The L-level voltage on the data line DT0 goes to the intermediate voltage HVDD after the column selection signal Yn is changed to the L level.

Likewise, at Time t4, the enable signal SEN for the sense amplifiers makes a transition from the L level to the H level. The H-level enable signal SEN activates the sense amplifiers 130. Specifically, the sense amplifier 130 associated with the memory cell MC00 amplifies the potential difference between the bit line BLT00 and bit line BLN00. Then, data "1" is written into the memory cell MC00 storing data "0". At the same time, the sense amplifier 130 associated with the memory cell MC0n amplifies the potential difference between the bit line BLT0n and bit line BLN0n. Then, the data "0" is written into the memory cell MC0n storing data "1".

After the data is written into the memory cells MC00 and MC0n, the voltage of the word line WL1 is changed from the H level to the L level at Time t5. The L-level word line WL1 causes the memory cells MC00 and MC0n to be deselected. At the same time, the precharge signal PDL makes a transition from the L level to the H level. The H-level precharge signal PDL changes the voltage of the bit lines BLT00, BLN00, BLT0n, and BLN0n to the intermediate voltages HVDD. In addition, the enable signal SEN for the sense amplifiers makes a transition from the H level to the L level. The L-level enable signal SEN deactivates the sense amplifiers 130.

As described above, the semiconductor device 100 according to the first embodiment adopts an early write mode in which the activation of sense amplifiers is performed after a column is selected and data is written into the bit line. Furthermore, the semiconductor device 100 according to the embodiment firstly allows the column decoder 150 to sequentially feed the associated column selection signals to the column selection gates, and then activates the associated sense amplifiers 130. For instance, at Time t4 in FIG. 4, the potential difference between the bit line BLT00 and bit line BLN00 associated with the column to which the column selection signal has been previously fed can be any values as long as they can be magnified by the sense amplifier 130.

Therefore, before the voltage of the first bit line or second bit line connected to a data line pair becomes the same as that of the data line pair, the column decoder 150 can switch over the output of the column selection signal. Thus, the transition time of the column selection signal to the H level can be shortened. In addition, the semiconductor device 100 can activate the plurality of sense amplifiers 130 simultaneously. Such a semiconductor device 100 does not require a sense amplifier control circuit for every sense amplifier. This configuration according to the first embodiment can provide a semiconductor device with improved write speeds without increasing the area thereof.

As shown in FIG. 4, the data line DT0 and data line DN0 transfer to the pair of bit lines a potential equal to or lower than the precharge potential of the pair of bit lines. Specifically, in a case where data "1" is written into a memory cell, the data line DT0 is set to the intermediate voltage, while the data line DN0 is set to the L level. In a case where data "0" is written into a memory cell, the data line DN0 is set to the intermediate voltage, while the data line DT0 is set to the L level. Transferring the potential of the data lines to the bit lines generates a potential difference between the first bit line 114 and second bit line 115, and the sense amplifier 130 amplifies the potential difference to perform a write operation. Thus, the semiconductor device 100 according to the first embodiment eliminates the need for a voltage booster circuit to increase the voltage of the column selection signal. By the way, the waveforms of the data line DT0 and data line DN0 are not limited to those described above. To write data "1" into a memory cell, the data line DT0 may be set to the H level, while the data line DN0 may be set to the L level. Similarly, to write data "0" into a memory cell, the data line DT0 may be set to the L level, while the data line DN0 may be set to the H level. Furthermore, the precharge potential of the data lines can be set to either the H level or the intermediate voltage HVDD.

Modification of First Embodiment

Figure 5:
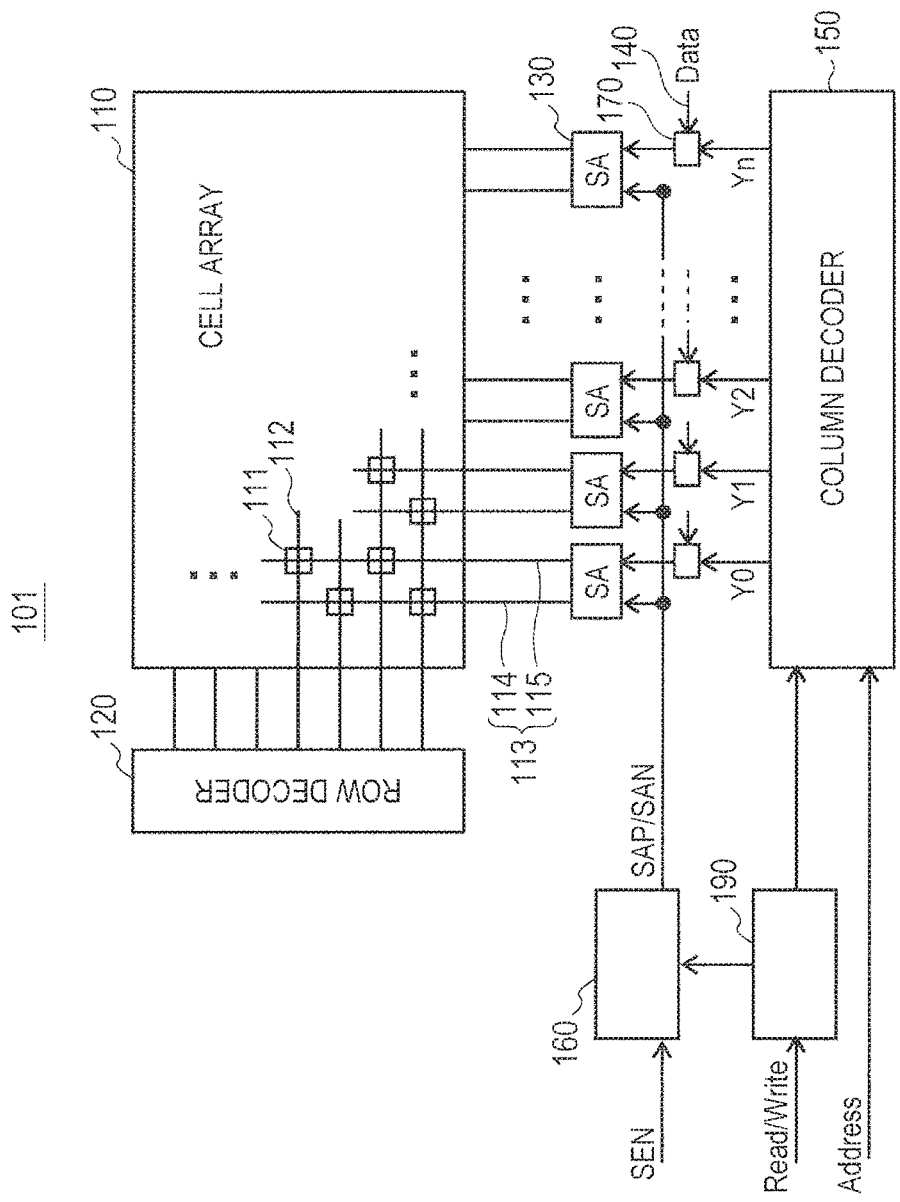
FIG. 5 is a block diagram of a semiconductor device according to a modification of the first embodiment.

With reference to FIG. 5, a modification of the first embodiment will be described. FIG. 5 is a block diagram of a semiconductor device according to the modification of the first embodiment. The semiconductor device 101 shown in FIG. 5 is different from the semiconductor device 100 shown in FIG. 1 in that it has a timing control circuit 190.

The timing control circuit 190 controls the time at which the column decoder 150 completes transmission of column selection signals, and the time at which the sense amplifier control circuit 160 activates the sense amplifiers 130. The column decoder 150 outputs column selection signals based on a command signal received from the timing control circuit 190. The timing control circuit 190 controls the sense amplifier control circuit 160 to activate the sense amplifiers 130 after output of column selection signals is completed.

Specifically, for example, the timing control circuit 190 instructs the column decoder 150 to select a column to perform a write operation. In accordance with the time at which the column selection is completed for the write operation, the timing control circuit 190 outputs an instruction to the sense amplifier control circuit 160 to activate the sense amplifiers 130. The completion time of the column selection for the write operation can be detected by monitoring the passage of predetermined time period. In this case, the timing control circuit 190 detects the time period by counting clocks. In addition, the timing control circuit 190 can be triggered by a feedback signal output from the column decoder 150 to the timing control circuit 190. The feedback signal may be generated by the column decoder 150 based on the results that the column selection has been determined to be completed. The determination whether the column selection has been completed can be made by detecting the absence of column address input for a given period. In addition, the timing control circuit 190 may output an enable signal for the sense amplifiers 130 to the sense amplifier control circuit 160 when the output of the column selection signals is completed.

The timing control circuit 190 may control the timing of the write operation in a burst mode. For instance, the timing control circuit 190 controls the column decoder 150 to output column selection signals required to perform burst processing. In addition, the timing control circuit 190 controls the sense amplifier control circuit 160 to activate the sense amplifiers 130 after the output of the column selection signals for the burst processing is completed.

According to the configuration, the write speed of the semiconductor device 101 can be improved without increasing the area thereof.

Second Embodiment

Next, with reference to FIGS. 6 to 11, the second embodiment will be described. The inventors reviewed the semiconductor device adopting an early write mode described in the first embodiment in order to optimize the write speed. The inventors investigated the transition of the voltage between pairs of bit lines of the semiconductor device from the time when a word selection signal is changed to an H level to the time when column selection signals are transmitted for the pairs of bit lines associated with the selected word line and then the voltages in the pairs of bit lines are amplified by the sense amplifiers. Following is description about four voltage transition patterns obtained from the investigation.

FIGS. 6 to 9 described below illustrate, as main signals, a selection signal of the word line WL, a column selection signal Yn, and an enable signal SE for sense amplifiers. FIGS. 6 to 9 also illustrate the voltage VMC of a memory cell MCn, the voltage of the first bit line BLTn associated with the memory cell MCn, and the voltage of the second bit line BLNn associated with the first bit line BLTn, the voltage being used as a reference voltage. The memory cell MCn is an example of a randomly chosen memory cell associated with each pattern. The precharge voltage, and signals on the data line pair and other elements are omitted from FIGS. 6 to 9; however, the omitted signals are properly functioning in the same manner as described with reference to FIG. 4. In addition, FIGS. 6 to 9 show signal waveforms with focus on the four patterns from Time ts to Time te; however, FIGS. 6 to 9 show only patterns relevant to the memory cell of interest through a series of actions to write into a plurality of the memory cells.

Figure 6:
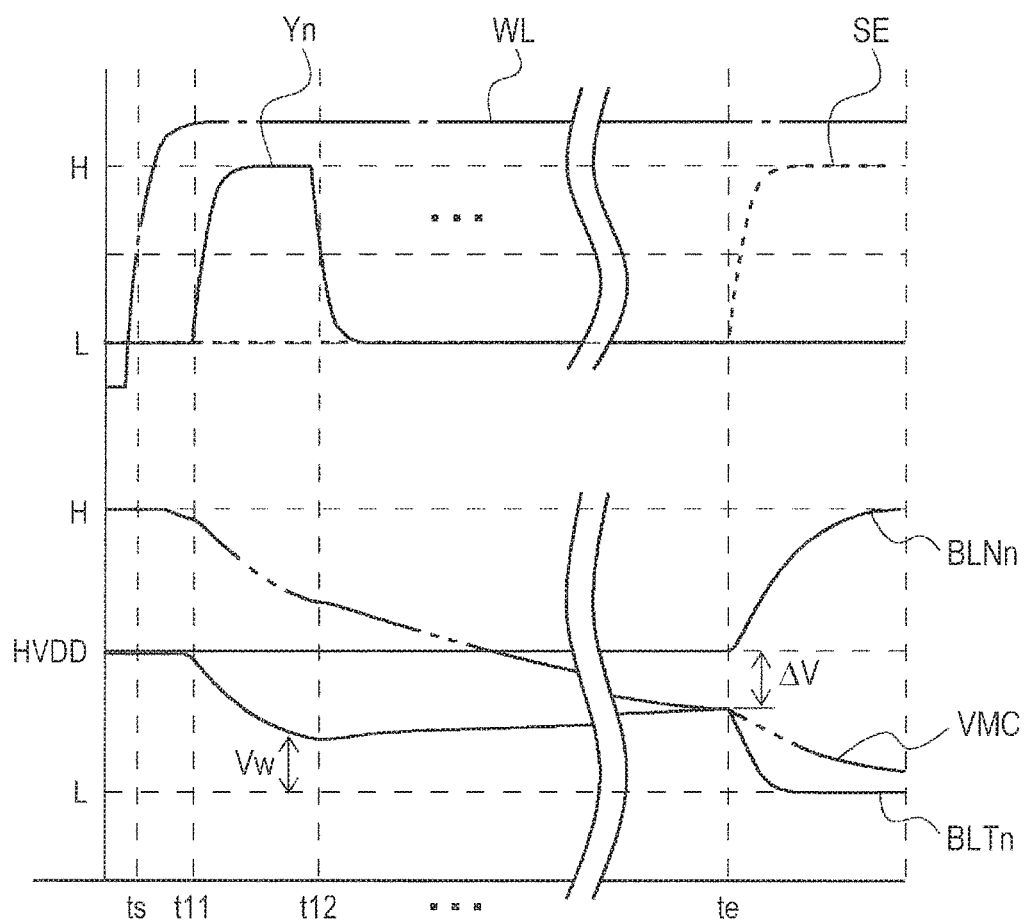
FIG. 6 is a timing diagram of the first pattern according to the second embodiment.

FIG. 6 is a timing diagram of the first pattern according to the second embodiment. The first pattern shows the voltages of a pair of bit lines when data "1" in a memory cell is overwritten with data "0" by a column selection signal which is one of the column selection signals output at an early stage from the column decoder. Consequently, in the first pattern, the voltage VMC of the memory cell is changed from the H level to the L level. Incidentally, the early stage defines the time, for example, from the start of sequential output of column selection signals by the column decoder to a point in time at which 10% of the column selection signals is output.

Firstly, at Time ts, a selection signal on a word line WL makes a transition from the L level to the H level. The H-level selection signal turns on a gate signal of the memory cell MCn. This lowers the H-level voltage VMC of the memory cell MCn gradually.

At Time t11, a column selection signal Yn makes a transition from the L level to the H level. The H-level column selection signal Yn turns on the column selection gate associated with the pair of bit lines associated with the memory cell MCn. The column selection gate in the on state connects the pair of bit lines associated with the memory cell MCn to the data line pair. To write data "0" into the memory cell MCn, in the first pattern, the data line pair lowers the voltage of the first bit line BLTn. On the other hand, the voltage of the second bit line BLNn is maintained at the intermediate voltage HVDD.

At Time t12, the column selection signal Yn makes a transition from the H level to the L level. The voltage of the first bit line BLTn has been lowered to a voltage Vw. On the other hand, the voltage VMC of the memory cell MCn has been lowered from the H level, but is still higher than the voltage Vw of the first bit line BLTn. Because of this, at and after Time t12, the voltage VMC of the memory cell MCn and the voltage of the first bit line BLTn move close to each other due to charge sharing. In short, the voltage VMC of the memory cell MCn goes down, while the voltage of the first bit line BLTn goes up. After a predetermined time has elapsed since Time t12, the voltage VMC of the memory cell MCn becomes the same as the voltage of the first bit line BLTn.

By Time te, the column decoder 150 completes transmission of all associated column selection signals. Then, the enable signal SE for the sense amplifiers makes a transition from the L level to the H level at Time te. The H-level enable signal SE activates the sense amplifiers 130 associated with the selection signal on the word line WL. The activated sense amplifiers 130 amplify the potential difference between the first bit line BLTn and second bit line BLNn. With the amplification of the potential difference between the first bit line BLTn and second bit line BLNn, the voltage VMC of the memory cell MCn goes down to the L level.

At Time te, the potential difference between the first bit line BLTn and second bit line BLNn is ΔV. If the ΔV value is greater than a preset value, the sense amplifier 130 can properly amplify the potential difference. On the other hand, if the ΔV value is not greater than the preset value, the sense amplifier 130 cannot properly amplify the potential difference. Therefore, it would be better to set the activation period of the column selection signal Yn in contemplation of the rise of the voltage Vw from Time t12 to Time te.

Figure 7:
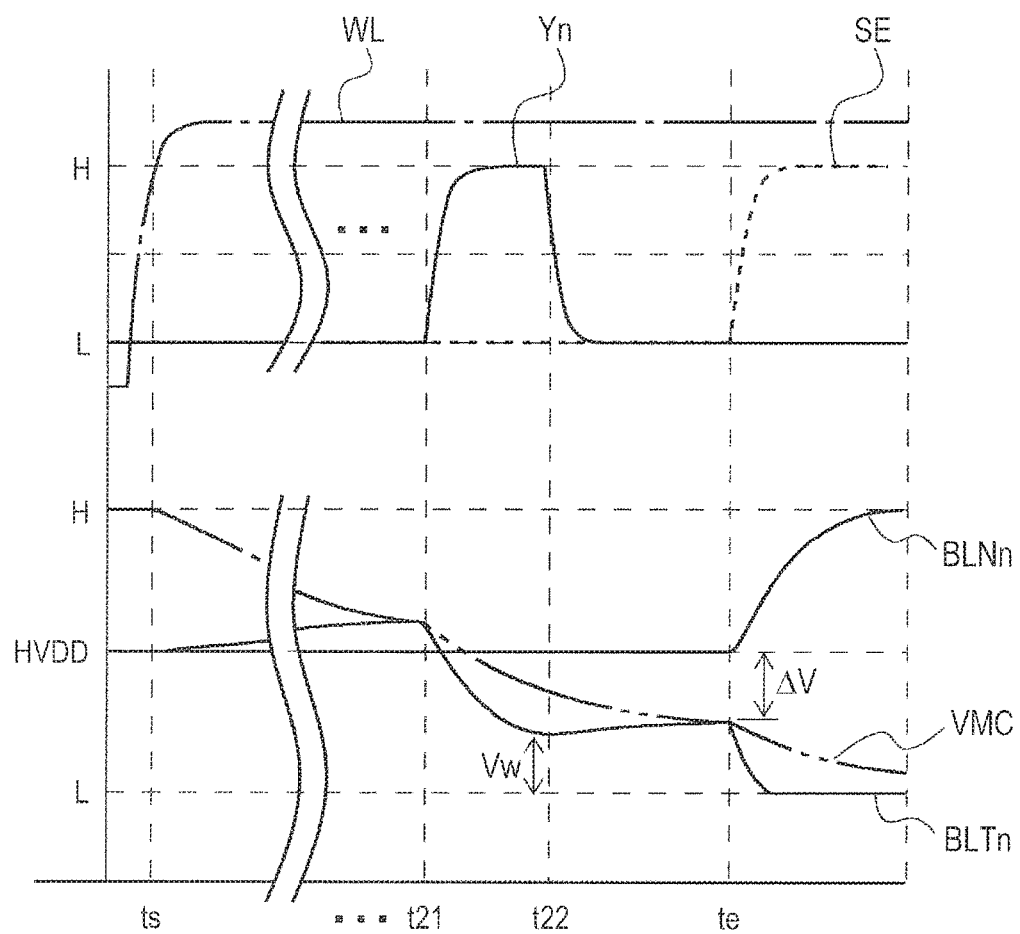
FIG. 7 is a timing diagram of the second pattern according to the second embodiment.

FIG. 7 is a timing diagram of the second pattern according to the second embodiment. The second pattern shows voltages of a pair of bit lines when data "1" in a memory cell is overwritten with data "0" by a column selection signal which is one of the column selection signals output at a late stage from the column decoder. Consequently, in the second pattern, the voltage VMC of the memory cell is changed from the H level to the L level. Incidentally, the late stage defines the time, for example, from the termination of sequential output of column selection signals by the column decoder to a point in time before the last 10% of the column selection signals is output.

Firstly, at Time ts, a selection signal on a word line WL makes a transition from the L level to the H level. The H-level selection signal turns on a gate signal of the memory cell MCn. This lowers the H-level voltage VMC of the memory cell MCn gradually. On the other hand, the voltage of the first bit line BLTn is raised gradually from the intermediate voltage HVDD due to charge sharing. After a predetermined time has elapsed since Time ts, the voltage VMC of the memory cell MCn becomes the same as the voltage of the first bit line BLTn.

At Time t21, the column selection signal Yn makes a transition from the L level to the H level. The H-level column selection signal Yn turns on the column selection gate associated with the pair of bit lines associated with the memory cell MCn. The column selection gate in the on state connects the pair of bit lines associated with the memory cell MCn to the data line pair. To write data "0" into the memory cell MCn, in the second pattern, the data line pair lowers the voltage of the first bit line BLTn. On the other hand, the voltage of the second bit line BLNn is maintained at the intermediate voltage HVDD.

At Time t22, the column selection signal Yn makes a transition from the H level to the L level. The voltage of the first bit line BLTn has been lowered to a voltage Vw. On the other hand, the voltage VMC of the memory cell MCn has been lowered from the H level, but is still higher than the voltage Vw of the first bit line BLTn. Because of this, at and after Time t22, the voltage VMC of the memory cell MCn and the voltage of the first bit line BLTn move close to each other due to charge sharing. In short, the voltage VMC of the memory cell MCn goes down, while the voltage of the first bit line BLTn goes up. After a predetermined time has elapsed since Time t22, the voltage VMC of the memory cell MCn becomes the same as the voltage of the first bit line BLTn.

By Time te, the column decoder 150 completes transmission of all associated column selection signals. Then, the enable signal SE for the sense amplifiers makes a transition from the L level to the H level at Time te. The H-level enable signal SE activates the sense amplifiers 130 associated with the selection signal on the word line WL. The activated sense amplifiers 130 amplify the potential difference between the first bit line BLTn and second bit line BLNn. With the amplification of the potential difference between the first bit line BLTn and second bit line BLNn, the voltage VMC of the memory cell MCn goes down to the L level.

At Time te, the potential difference between the first bit line BLTn and second bit line BLNn is ΔV. If the ΔV value is greater than a preset value, the sense amplifier 130 can properly amplify the potential difference. On the other hand, if the ΔV value is not greater than the preset value, the sense amplifier 130 cannot properly amplify the potential difference. Therefore, it would be better to set the length of the column selection signal Yn in contemplation of the rise of the voltage Vw from Time t22 to Time te.

Figure 8:
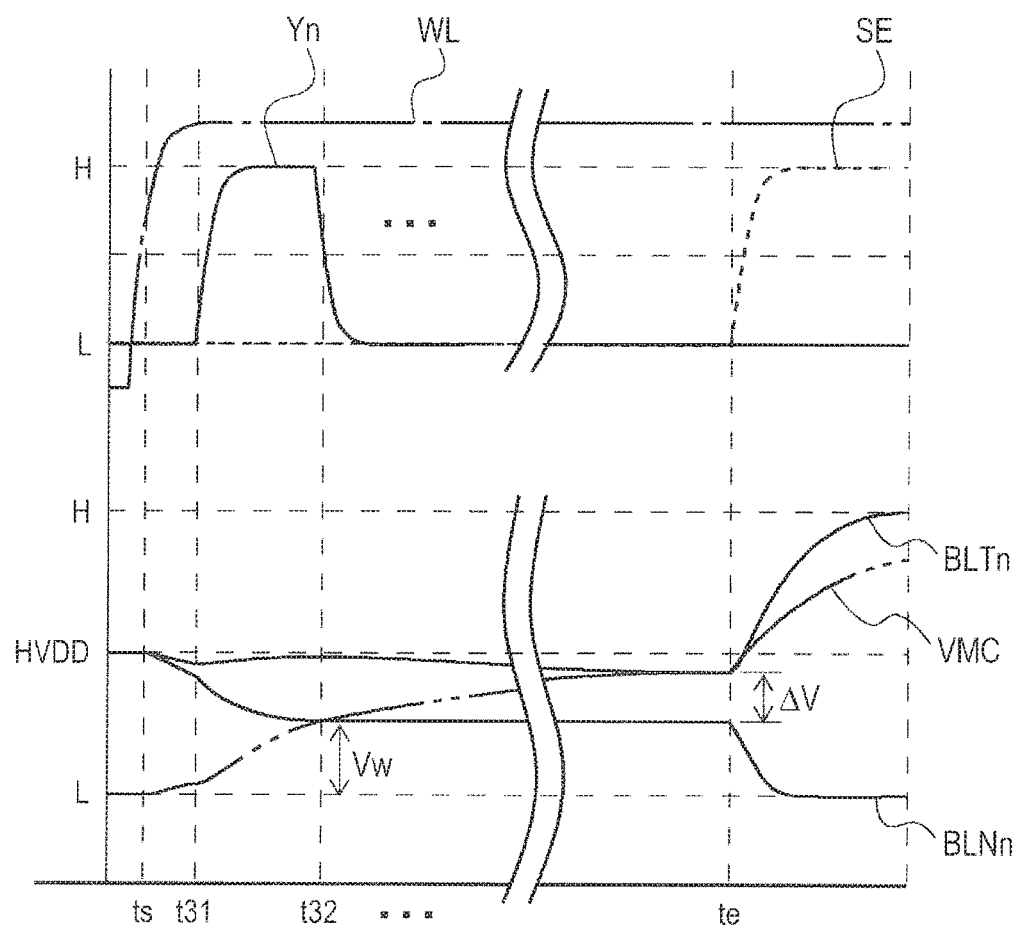
FIG. 8 is a timing diagram of the third pattern according to the second embodiment.

FIG. 8 is a timing diagram of the third pattern according to the second embodiment. The third pattern shows voltages of a pair of bit lines when data "0" in a memory cell is overwritten with data "1" by a column selection signal which is one of the column selection signals output at an early stage from the column decoder. In short, in the second pattern, the voltage VMC of the memory cell is changed from the H level to the L level.

Firstly, at Time ts, a selection signal on a word line WL makes a transition from the L level to the H level. The H-level selection signal turns on a gate signal of the memory cell MCn. This raises the L-level voltage VMC of the memory cell MCn gradually. On the other hand, the voltage of the first bit line BLTn is lowered gradually from the intermediate voltage HVDD due to charge sharing.

At Time t31, the column selection signal Yn makes a transition from the L level to the H level. The H-level column selection signal Yn turns on the column selection gate associated with the pair of bit lines associated with the memory cell MCn. The column selection gate in the on state connects the pair of bit lines associated with the memory cell MCn to the data line pair. To write data "1" into the memory cell MCn, in the third pattern, the data line pair lowers the voltage of the second bit line BLNn. On the other hand, the voltage of the first bit line BLTn is raised to the intermediate voltage HVDD by receiving the intermediate voltage from the data line pair.

At Time t32, the column selection signal Yn makes a transition from the H level to the L level. The voltage of the second bit line BLNn has been lowered to a voltage Vw and is maintained at the voltage Vw. On the other hand, the voltage VMC of the memory cell MCn has been raised from the L level, but is still lower than the voltage of the first bit line BLTn. Because of this, at and after Time t32, the voltage VMC of the memory cell MCn and the voltage of the first bit line BLTn move close to each other due to charge sharing. In short, the voltage VMC of the memory cell MCn goes up, while the voltage of the first bit line BLTn goes down. After a predetermined time has elapsed since Time t32, the voltage VMC of the memory cell MCn becomes the same as the voltage of the first bit line BLTn.

By Time te, the column decoder 150 completes transmission of all associated column selection signals. Then, the enable signal SE for the sense amplifiers makes a transition from the L level to the H level at Time te. The H-level enable signal SE activates the sense amplifiers 130 associated with the selection signal on the word line WL. The activated sense amplifiers 130 amplify the potential difference between the first bit line BLTn and second bit line BLNn. With the amplification of the potential difference between the first bit line BLTn and second bit line BLNn, the voltage VMC of the memory cell MCn goes up to the H level.

At Time te, the potential difference between the first bit line BLTn and second bit line BLNn is ΔV. If the ΔV value is greater than a preset value, the sense amplifier 130 can properly amplify the potential difference. On the other hand, if the ΔV value is not greater than the preset value, the sense amplifier 130 cannot properly amplify the potential difference. Therefore, it would be better to set the length of the column selection signal Yn in contemplation of the fall of the voltage of the first bit line BLTn from Time t32 to Time te.

Figure 9:
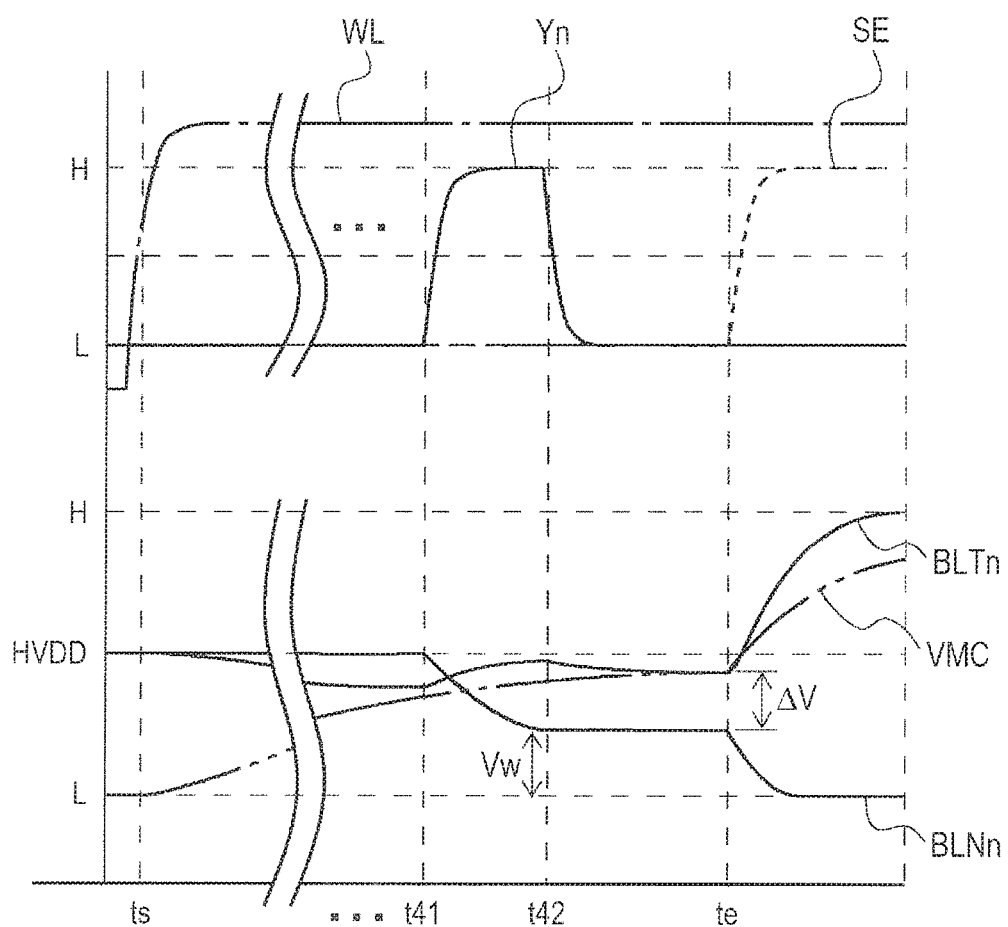
FIG. 9 is a timing diagram of the fourth pattern according to the second embodiment.

FIG. 9 is a timing diagram of the fourth pattern according to the second embodiment. The fourth pattern shows voltages of a pair of bit lines when data "0" in a memory cell is overwritten with data "1" by a column selection signal which is one of the column selection signals output at a late stage from the column decoder. In short, in the fourth pattern, the voltage VMC of the memory cell is changed from the L level to the H level.

Firstly, at Time ts, a selection signal on a word line WL makes a transition from the L level to the H level. The H-level selection signal turns on a gate signal of the memory cell MCn. This raises the L-level voltage VMC of the memory cell MCn gradually. On the other hand, the voltage of the first bit line BLTn is lowered gradually from the intermediate voltage HVDD due to charge sharing.

At Time t41, the column selection signal Yn makes a transition from the L level to the H level. The H-level column selection signal Yn turns on the column selection gate associated with the pair of bit lines associated with the memory cell MCn. The column selection gate in the on state connects the pair of bit lines associated with the memory cell MCn to the data line pair. To write data "1" into the memory cell MCn, in the fourth pattern, the data line pair lowers the voltage of the second bit line BLNn. On the other hand, the voltage of the first bit line BLTn is raised to the intermediate voltage HVDD by receiving the intermediate voltage from the data line pair.

At Time t42, the column selection signal Yn makes a transition from the H level to the L level. The voltage of the second bit line BLNn has been lowered to a voltage Vw and is maintained at the voltage Vw. On the other hand, the voltage VMC of the memory cell MCn has been raised from the L level, but is still lower than the voltage of the first bit line BLTn. Because of this, at and after Time t42, the voltage VMC of the memory cell MCn and the voltage of the first bit line BLTn move close to each other due to charge sharing. In short, the voltage VMC of the memory cell MCn goes up, while the voltage of the first bit line BLTn goes down. After a predetermined time has elapsed since Time t42, the voltage VMC of the memory cell MCn becomes the same as the voltage of the first bit line BLTn.

By Time te, the column decoder 150 completes transmission of all associated column selection signals. Then, the enable signal SE for the sense amplifiers makes a transition from the L level to the H level at time te. The H-level enable signal SE activates the sense amplifiers 130 associated with the selection signal on the word line WL. The activated sense amplifiers 130 amplify the potential difference between the first bit line BLTn and second bit line BLNn. With the amplification of the potential difference between the first bit line BLTn and second bit line BLNn, the voltage VMC of the memory cell MCn goes up to the H level.

At Time te, the potential difference between the first bit line BLTn and second bit line BLNn is ΔV. If the ΔV value is greater than a preset value, the sense amplifier 130 can properly amplify the potential difference. On the other hand, if the ΔV value is not greater than the preset value, the sense amplifier 130 cannot properly amplify the potential difference. Therefore, it would be better to set the length of the column selection signal Yn in contemplation of the fall of the voltage of the first bit line BLTn from Time t42 to Time te.

Figure 10:
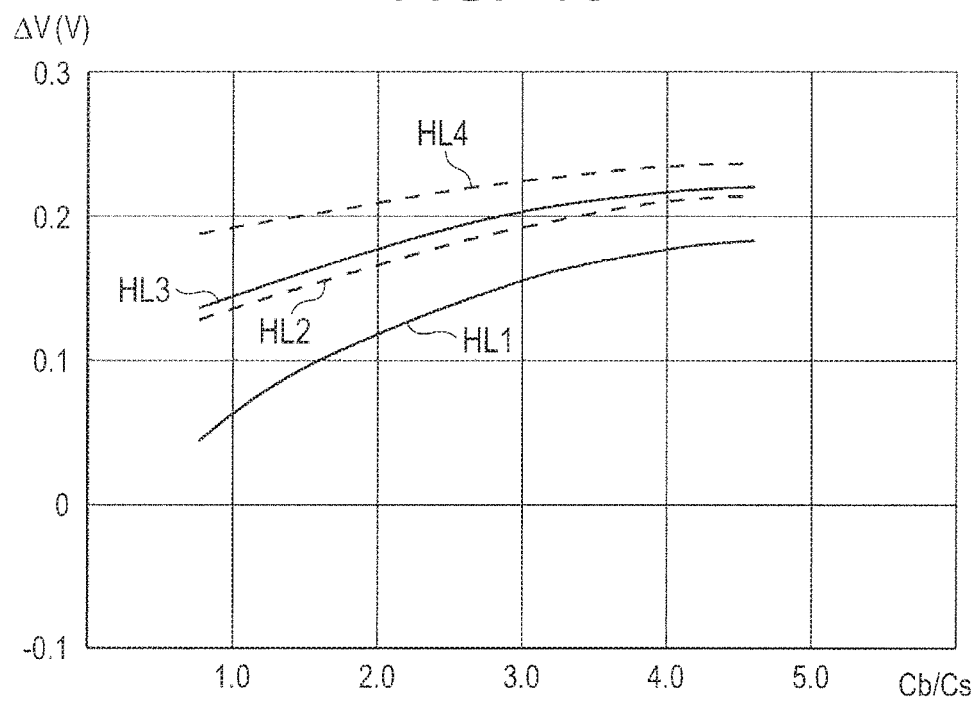
FIG. 10 is a graph showing the relationship between capacitance ratios and potential differences between a pair of bit lines of the semiconductor device according to the second embodiment.

Next, with reference to FIGS. 10 and 11, study results of the relationship between the activation period of a column selection signal Yn and the capacity of a cell array will be described. The inventors have advanced their own research using the following parameters: the time to start outputting column selection signals Yn; the activation period of the column selection signals Yn; the number of memory cells coupled to a first bit line BLTn; etc. FIG. 10 is a graph showing the relationship between the capacity ratio and the potential difference in a pair of bit lines of the semiconductor device according to the second embodiment. In FIG. 10, the vertical axis represents the potential difference ΔV between a first bit line BLTn and a second bit line BLNn at Time t3 shown in FIGS. 6 to 9. In other words, ΔV on the vertical axis is the potential difference between the pair of bit lines immediately before being amplified by a sense amplifier 130. In FIG. 10, the horizontal axis represents the capacitance ratio Cb/Cs between a stray capacitance Cb of the first bit line BLTn and a capacitance Cs of a memory cell. More specifically, the capacitance ratio Cb/Cs is a value obtained by dividing a stray capacitance Cb of the first bit line BLTn by a capacitance Cs of the memory cell coupled to the first bit line BLTn. The data shown in FIG. 10 is obtained when the supply voltage VDD of the semiconductor device is 1.0 V.

In FIG. 10, the curve HL1 indicated by a solid line is obtained when the activation period of a column selection signal Yn is shorter than those for curves HL3, HL4, which will be described later, the column selection signal Yn is one of the column selection signals output in an early stage by the column decoder, and data "0" is written into a memory cell storing data "1". According to the curve HL1, when the capacitance ratio Cb/Cs of the semiconductor device is 1.0 under the aforementioned conditions, ΔV is about 0.06 V. When the capacitance ratio Cb/Cs on the curve HL1 is increased, the ΔV value is also increased accordingly. With an increase of the capacitance ratio Cb/Cs, the increase rate of the ΔV to the capacitance ratio Cb/Cs gradually decreases. The gradual decrease manifests itself as a moderate inclination on the right side of the curve HL1 as shown in FIG. 10. When the capacitance ratio Cb/Cs is 4.0, the curve HL1 has a ΔV of about 0.17 V.

The curve HL2 indicated by a dashed line is obtained when the activation period of a column selection signal Yn is shorter than those for the curves HL3, HL4, which will be described later, the column selection signal Yn is one of the column selection signals output in a late stage by the column decoder, and data "0" is written into a memory cell storing data "1".

The curve HL3 indicated by a solid line is obtained when the activation period of a column selection signal Yn is longer than those for the aforementioned curves HL1, HL2, the column selection signal Yn is one of the column selection signals output in an early stage by the column decoder, and data "0" is written into a memory cell storing data "1".

The curve HL4 indicated by a dashed line is obtained when the activation period of a column selection signal Yn is longer than those for the aforementioned curves HL1, HL2, the column selection signal Yn is one of the column selection signals output in a late stage by the column decoder, and data "0" is written into a memory cell storing data "1".

Comparing the curves HL1 to HL4, the curve HL1 has the lowest potential differences ΔV at all capacitance ratio values. The curve HL2 has potential differences ΔV higher than the curve HL1, but lower than the curve HL3. The curve HL3 has potential differences ΔV higher than the curve HL2, but lower than the curve HL4. The curve HL4 has the highest potential differences ΔV in all of the curves.

Figure 11:
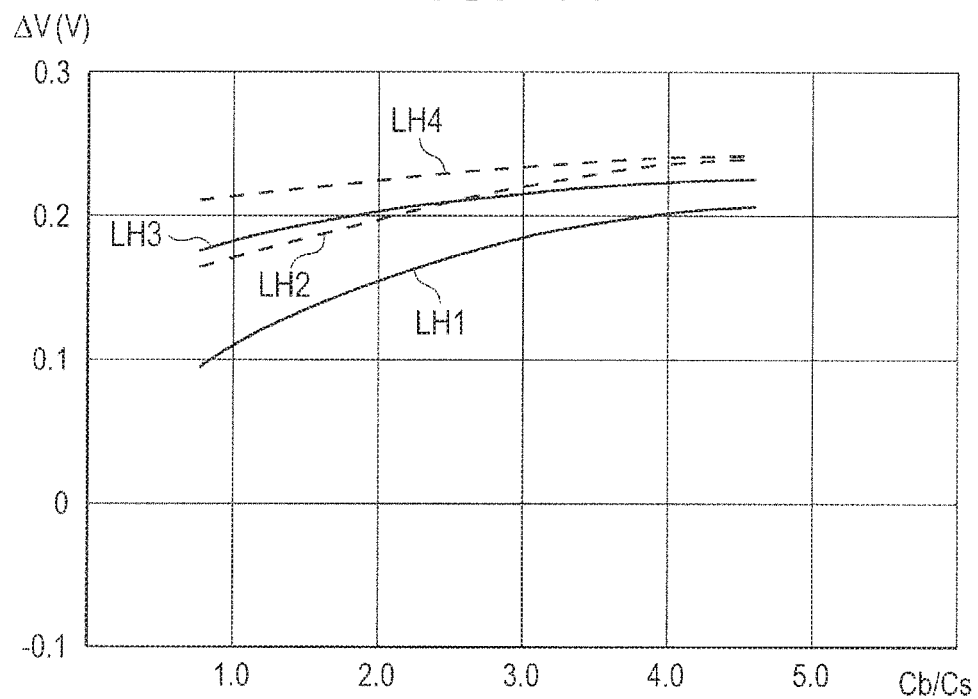
FIG. 11 is a graph showing the relationship between capacitance ratios and potential differences between a pair of bit lines of the semiconductor device according to the second embodiment.

Next, FIG. 11 shows curves obtained under the same conditions as those shown in FIG. 10 except that data "1" is written into a memory cell storing data "0". FIG. 11 is a graph showing the relationship between the capacitance ratio and the potential difference between a pair of bit lines of the semiconductor device according to the second embodiment.

In FIG. 11, the curve LH1 indicated by a solid line is obtained when the activation period of a column selection signal Yn is shorter than those for curves LH3, LH4, which will be described later, the column selection signal Yn is one of the column selection signals output in an early stage by the column decoder, and data "1" is written into a memory cell storing data "0". The curve LH1 is delineated in the same manner as the curve HL1; however, the curve LH1 has a potential difference ΔV of about 0.11 V at a capacitance ratio of 1.0, and has a potential difference ΔV of 0.2 V at a capacitance ratio of 4.0.

In FIG. 11, the curve LH2 indicated by a dashed line is obtained when the activation period of a column selection signal Yn is shorter than those for the curves LH3, LH4, which will be described later, the column selection signal Yn is one of the column selection signals output in a late stage by the column decoder, and data "1" is written into a memory cell storing data "0".

In FIG. 11, the curve LH3 indicated by a solid line is obtained when the activation period of a column selection signal Yn is longer than those for the aforementioned curves LH1, LH2, the column selection signal Yn is one of the column selection signals output in an early stage by the column decoder, and data "1" is written into a memory cell storing data "0".

In FIG. 11, the curve LH4 indicated by a dashed line is obtained when the activation period of a column selection signal Yn is longer than those for the aforementioned curves LH1, LH2, the column selection signal Yn is one of the column selection signals output in a late stage by the column decoder, and data "1" is written into a memory cell storing data "0".

Comparing the curves LH1 to LH4, the curve LH1 has the lowest potential differences ΔV at all capacitance ratio values. The curve LH2 has potential differences ΔV lower than those of the curve LH3 at capacitance ratios in the neighborhood of 0.8 to 2.5, but has potential differences ΔV higher than those of the curve LH3 at capacitance ratios in the neighborhood of 2.5 to 4.6. The potential differences ΔV on the curve LH4 are higher than potential differences on any other curves.

As seen from the above description, the inventors compared various patterns in write operations, and reviewed conditions to optimize the column selection signal Yn and capacitance ratio. In this embodiment, the potential difference limit that the sense amplifiers 130 can amplify without malfunctions is 0.05 V. To provide an adequate margin in order to prevent the sense amplifiers 130 from operating improperly, the activation period for the column selection signal Yn should be made longer, as is apparent from the comparison between, for example, the curves HL1 and HL3. However, a longer activation period for the column selection signal Yn of course extends time for the write operation, resulting in write speed degradation. Therefore, it is desirable to shorten the activation period of the column selection signal Yn to within the range in which the sense amplifiers 130 can operate properly. In addition, lower capacitance ratios can increase design freedom. Specifically, the design freedom is increased by shortening the bit line per a memory cell. In view of the aforementioned conditions, the inventors examined the investigation results shown in FIGS. 10 and 11.

In the various patterns shown in FIGS. 10 and 11, the curve HL1 has potential differences close to the limit that the sense amplifiers 130 can amplify without introducing errors. The curve HL1 has a tendency to decrease the potential difference ΔV with a decrease in the capacitance ratio. Because of the tendency, a capacitance ratio Cb/Cs of 1.0 or higher is conditional for the semiconductor device associated with the curve HL1 to operate normally. Also, the inventors discovered that DRAM devices with 256 memory cells per bit line manufactured through general processes have a capacitance ratio Cb/Cs of about 8. When the number of memory cells per bit line is 32, which is obtained by dividing 256 by 8, the capacitance ratio Cb/Cs is 1.0. Therefore, setting the number of memory cells per bit line to 32 or more can improve the write speed of the semiconductor device without increasing the area. In other words, for example, the semiconductor device 100 of the first embodiment having the first bit lines 114 each coupled to 32 or more memory cells 111 would be a preferable condition to improve the write speed without an increase in area.

Third Embodiment

Figure 12:
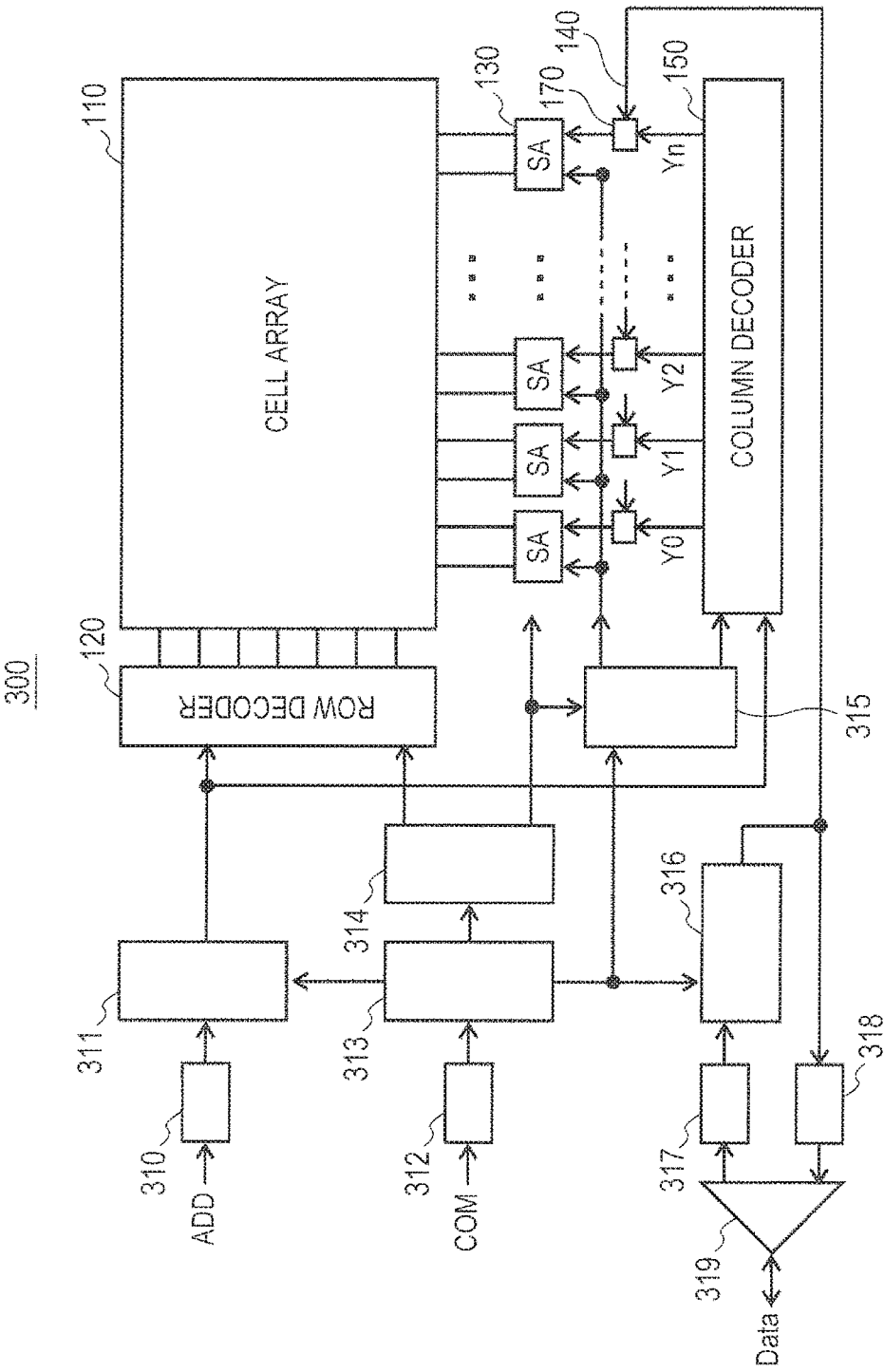
FIG. 12 is a block diagram of a semiconductor device according to the third embodiment.
Figure 13:
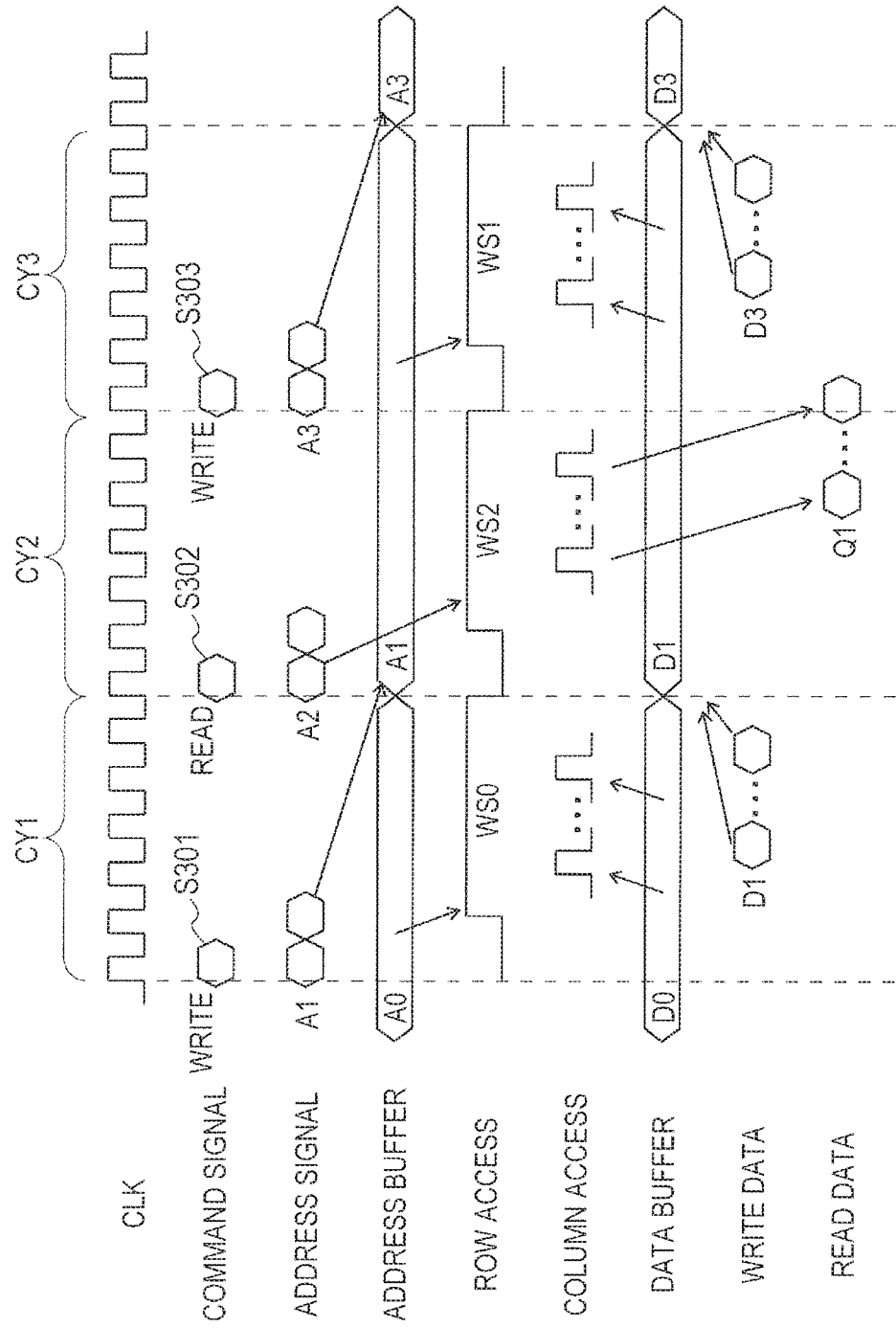
FIG. 13 is a timing diagram of the semiconductor device according to the third embodiment.

Next, with reference to FIGS. 12 and 13, the third embodiment will be described. FIG. 12 is a block diagram of a semiconductor device according to the third embodiment. The semiconductor device 300 according to the third embodiment adopts a so-called late write mode, and is different from the semiconductor device according to the first embodiment in that point. When a write request is issued, the semiconductor device 300 using the late write mode temporarily stores a write address and write data fed from an external device into a buffer provided therein. The temporarily-stored address signal and data are written into a memory cell when the next write request is issued.

The semiconductor device 300 shown in FIG. 12 includes a cell array 110, a row decoder 120, sense amplifiers 130, a column decoder 150, and a column selection circuit 170. The semiconductor device 300 further includes an address signal register 310, an address buffer 311, a command register 312, a command control circuit 313, a row control circuit 314, a column control circuit 315, a data buffer 316, a write data register 317, a read data register 318, and a data input/output circuit 319.

The address signal register 310 receives an address signal from an external device, and stores the received address signal. The address buffer 311 is coupled to the address signal register 310, and stores the address signal that is set at the time of reading and writing in the late write mode. The address buffer 311 feeds the stored address signal to the row decoder 120 and column decoder 150 in response to an instruction from the command control circuit 313.

The command register 312 stores a command signal received from an external device. The command signal is a read command signal or a write command signal.

The command control circuit 313 receives the command signal from the command register 312, and transmits an instruction corresponding to the received command to the address buffer 311, row control circuit 314, column control circuit 315, and data buffer 316. More specifically, the command control circuit 313 outputs data associated with a write operation and an address signal of the memory cell associated with the data after a preset delay. In short, the command control circuit 313 performs a so-called late write mode control.

The row control circuit 314 receives the instruction from the command control circuit 313, and instructs the row decoder 120 to output a row selection signal associated with a read operation or write operation in accordance with the received instruction. The row control circuit 314 also transmits an instruction associated with the read operation or write operation to the sense amplifiers 130 and column control circuit 315.

The column control circuit 315 receives signals from the command control circuit 313 and row control circuit 314, and transmits an instruction corresponding to the received signals to the column decoder 150 and sense amplifiers 130.

The data buffer 316 is coupled to the write data register 317 to store data associated with the address signal set at the time of writing in the late write mode. In addition, the data buffer 316 transfers the stored data to data line pairs 140 in response to the instruction from the command control circuit 313.

The write data register 317 receives write data from the data input/output circuit 319, and stores the received data. The read data register 318 receives read data from the cell array 110 via the data line pairs 140, and stores the received data.

Next, with reference to FIG. 13, processing performed by the semiconductor device according to the third embodiment will be described. FIG. 13 is a timing diagram of the semiconductor device according to the third embodiment. The semiconductor device 300 according to the third embodiment is set to alternately perform a write operation and a read operation each within the same number of clock cycles.

In a cycle CY1, the semiconductor device 300 receives a write command from an external device (step S301). The semiconductor device 300 receives a write address A1 with the write command. The write address A1 supplied in the cycle CY1 is transferred to the address buffer 311. The write address A1 is held in the address buffer 311 without being output to the cell array 110 during the cycle CY1, and is output in a cycle CY3 in which the next write command is issued.

Then, the data input/output circuit 319 is supplied with write data D1 associated with the write address A1. The supplied write data D1 is transferred to the data buffer 316. The write data D1 is held in the data buffer 316 without being output to the cell array 110 during the cycle CY1, and is output in a cycle CY3 in which the next write command is issued.

Next, in a cycle CY2, the semiconductor device 300 receives a read command from an external device (step S302). The semiconductor device 300 receives a read address A2 with the read command. The command control circuit 313 outputs the supplied read address A2 to the row decoder 120 and column decoder 150 within the time period of the cycle CY2. The semiconductor device 300 reads out data from the memory cell corresponding to the read address A2, and stores the read data Q1 in the read data register 318.

The operation to read the read data Q1 continues even after the start of the cycle CY3 because the data to be read still remains in the read data register 318 at the point when a word-line selection signal WS2 is turned off in the cycle CY2. In the early write mode adopted in this embodiment, the write data is input to the bit lines after a word-line selection signal WS1 has been output. Therefore, if the late write mode is not adopted, the read data remaining in the cycle CY2 may cause a delay of the write data to be supplied in the cycle CY3.

Next, in the cycle CY3, the semiconductor device 300 receives a write command from an external device (step S303). The semiconductor device 300 receives a write address A3 with the write command. The write address A3 supplied in the cycle CY3 is transferred to the address buffer 311. The write address A3 is held in the address buffer 311 without being output to the cell array 110 during the cycle CY3, and is output in a subsequent cycle in which the next write command is issued. The command control circuit 313 instructs the address buffer 311 to output the write address A1, which was supplied with the previous write command and has been held in the address buffer 311, to the row decoder 120.

The semiconductor device 300 is also supplied with data D3 associated with the write address A3 in accordance with the write command. The supplied data D3 in the cycle CY3 is transferred to the data buffer 316. The write data D3 is held in the data buffer 316 without being output to the cell array 110 during the cycle CY3, and is output in a subsequent cycle in which the next write command is issued.

In the cycle CY3, the command control circuit 313 instructs the address buffer 311 to output the write address A1, which was stored in the address buffer 311 in the cycle CY1 in which the previous write command was issued, to the row decoder 120. Similarly, the command control circuit 313 instructs the data buffer 316 to output the write data D1, which was stored in the data buffer 316 in the cycle CY1, to the column decoder 150. In other words, in the cycle CY3, the semiconductor device 300 performs a write operation associated with the previously received write command.

As described above, in the late write mode, the write data is temporarily stored in the address buffer. Therefore, the semiconductor device adopting the late write mode can start a write operation using the previously stored write data without waiting for read data to be completely output. In the case where the semiconductor device additionally adopts an early write mode, the row decoder and column decoder can receive write data in a write cycle after data has been output in the read cycle. Therefore, the semiconductor device adopting the late write mode and early write mode does not need to ensure latency between the read cycle and write cycle. Thus, with the combined use of the early write mode and late write mode, the semiconductor device 300 according to the third embodiment can decrease the processing delay and improve the data processing performance.

Fourth Embodiment

Figure 14:
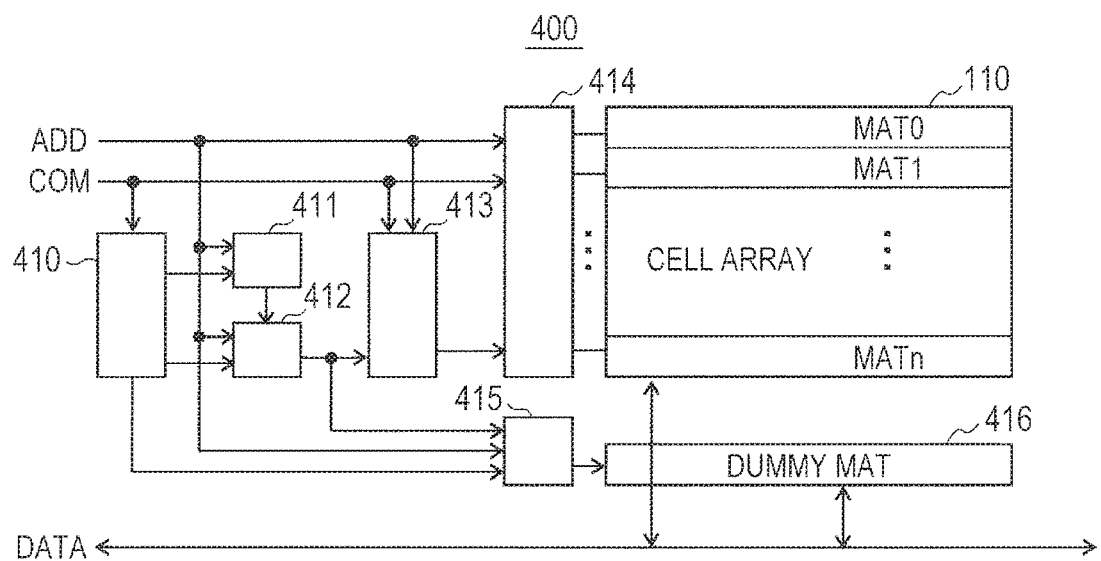
FIG. 14 is a block diagram of a semiconductor device according to the fourth embodiment.
Figure 15:
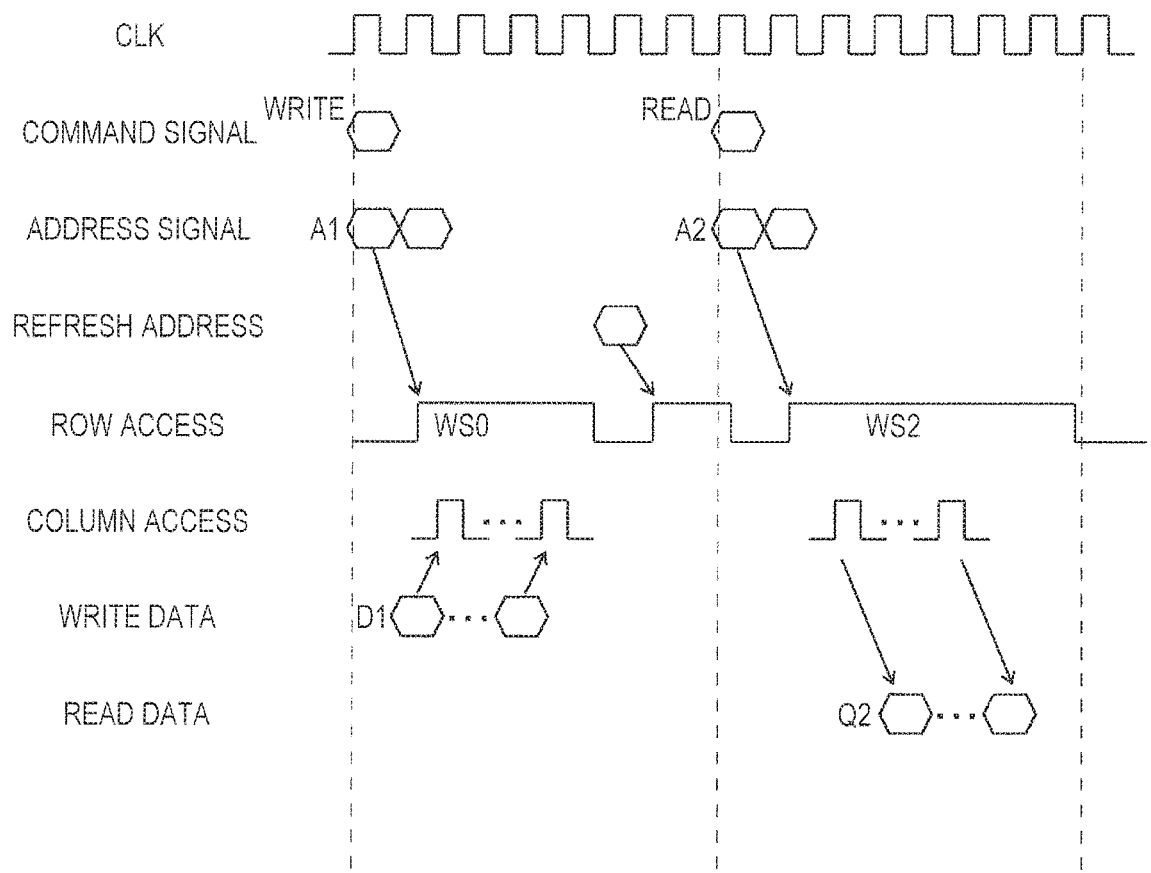
FIG. 15 is a timing diagram of the semiconductor device according to the fourth embodiment.

Next, with reference to FIGS. 14 and 15, the fourth embodiment will be described. FIG. 14 is a block diagram of a semiconductor device according to the fourth embodiment. The semiconductor device 400 shown in FIG. 14 is different from the semiconductor device of the first embodiment in the following points: the semiconductor device 400 has a dummy mat of sub-arrays; and the semiconductor device 400 has a circuit for controlling the dummy mat. The semiconductor device 400 is configured to perform a read or write operation on each sub-array. In addition, the semiconductor device 400 can copy data of a sub-array under a read operation to a dummy mat 416 to use the dummy mat 416 instead of the copy source sub-array.

The semiconductor device 400 includes a plurality of sub-arrays (MAT0 to MATn) in a cell array 110. The semiconductor device 400 also includes a dummy mat control circuit 410, a tag register 411, a determination circuit 412, a refresh circuit 413, a main memory control circuit 414, a dummy memory control circuit 415, and a dummy mat 416.

The dummy mat control circuit 410 receives a read or write command signal from an external device, and transmits a command signal corresponding to the received command signal to the tag register 411, determination circuit 412, and dummy memory control circuit 415.

The tag register 411 receives an address signal from the external device. The tag register 411 also receives a read or write command signal from the dummy mat control circuit 410, and stores an address signal associated with the read commands a predetermined number of times. In addition, the tag register 411 transmits an address signal associated with a read command stored in the past to the determination circuit 412.

The determination circuit 412 receives the address signal associated with the past read command from the tag register 411. The determination circuit 412 also receives a request address signal, which is currently requested by the external device, and determines whether the received request address signal is included in the address signals associated with the past read commands. In addition, the determination circuit 412 receives a read or write command signal from the dummy mat control circuit 410. If the determination circuit 412 determines that the request address signal received from the external device to perform a read operation is found in the address signals associated with the past read commands received from the tag register 411, the determination circuit 412 transmits an instruction to the dummy memory control circuit 415 to read out the data in the dummy mat 416 associated with the request address signal. At the same time, the determination circuit 412 instructs the refresh circuit 413 to refresh the cell array 110.

The refresh circuit 413 receives a read or write command signal and an address signal from an external device. The refresh circuit 413 also receives an instruction to perform a refresh operation from the determination circuit 412. Then, the refresh circuit 413 transmits an instruction to the main memory control circuit 414 to perform a refresh operation in accordance with the received signals. If the semiconductor device 400 receives a write command from an external device, for example, the semiconductor device 400 performs a refresh operation on any sub-array(s) according to the instruction from the refresh circuit during a write cycle. If the semiconductor device 400 receives a read command from an external device, the semiconductor device 400 performs a refresh operation on any sub-array(s) in accordance with the instruction from the determination circuit 412.

Thus, the number of refresh instructions provided by an external device can be decreased by actuating the refresh circuit 413. In addition, actuation of the determination circuit 412 and refresh circuit 413 can implement a hidden refresh that allows the semiconductor device to appropriately perform a refresh operation in the circuit configuration shown in FIG. 14 without a refresh instruction from the external device. The hidden refresh is a refresh operation performed in the semiconductor device that does not need refresh instructions from outside of the semiconductor device, and also does not cause operational delay.

The main memory control circuit 414 has circuitry for performing a read and write operation on the cell array 110. More specifically, the main memory control circuit 414 includes, for example, a column decoder, a row decoder, sense amplifiers, and other components.

The dummy memory control circuit 415 receives a determination result from the determination circuit 412, an address signal from an external device, and a read or write command signal from the dummy mat control circuit 410. The dummy memory control circuit 415 performs a read or write operation on the dummy mat 416 in accordance with the received signals. More specifically, for example, if the determination circuit 412 determines that a request address signal is included in the past address signals, the dummy memory control circuit 415 reads out data associated with the request address signal from the dummy mat 416.

Next, with reference to FIG. 15, processing performed by the semiconductor device according to the fourth embodiment will be described. FIG. 15 is a timing diagram of the semiconductor device according to the fourth embodiment.

The semiconductor device 400 according to the fourth embodiment is set to alternately perform a write operation and a read operation each within the same number of clock cycles. In FIG. 15, the semiconductor device 400 receives a write command from an external device. At the same time, the semiconductor device 400 receives an address signal A1 associated with the write command, and performs a write operation associated with the address signal A1.

By the way, the semiconductor device 400 operates in the early write mode described in the first embodiment. Such a semiconductor device 400 takes a shorter time to complete a write operation than a read process. Therefore, as shown in FIG. 15, a command to instruct a refresh address can be issued while the write command is being processed. This means that the semiconductor device 400 performs a refresh operation on the addressed sub-array after sense amplifiers are activated during a write operation.

According to the above-described configuration, the semiconductor device 400 can be adapted to receive a write command and a command to instruct a refresh address in a write cycle. In addition, the semiconductor device 400 can carry out a hidden refresh operation so as to issue a command to instruct a refresh address within the circuit configuration shown in FIG. 14. Thus, the fourth embodiment can provide a semiconductor device with improved data processing efficiency.

Fifth Embodiment

Next, with reference to FIGS. 16 and 17, the fifth embodiment will be described. The semiconductor device according to the fifth embodiment has sense amplifiers configured differently from those in the semiconductor device according to the first embodiment.

Figure 16:
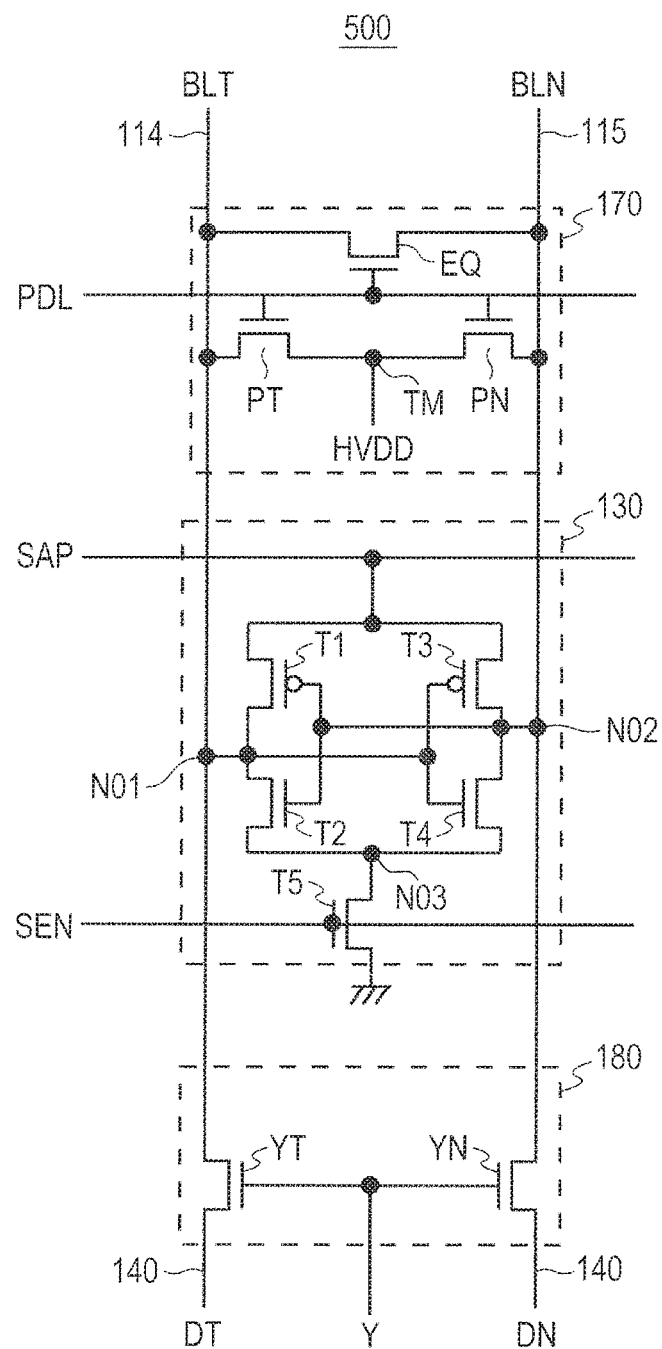
FIG. 16 is a circuit diagram of a sense amplifier and its periphery in a semiconductor device according to the fifth embodiment.

FIG. 16 is a circuit diagram of a sense amplifier and its periphery in the semiconductor device according to the fifth embodiment. As shown in FIG. 16, a node N03 couples a transistor T2 and a transistor T4 at their drains. The sense amplifier 130 has a transistor T5 between the node N03 and the ground voltage. Unlike the semiconductor device 100 according to the first embodiment shown in FIG. 2, the sense amplifier 130 further includes the transistor T5 that is a switch element provided between supply voltage terminals to switch between activation and deactivation.

The transistor T5 reduces malfunctions from occurring when the transistor T2 or T4 of the sense amplifier is accidentally turned on. For instance, in FIG. 16, if a column selection signal Y is turned on when a data line DN has an L-level voltage and a data line DT has an intermediate voltage HVDD, the voltage of the second bit line 115 connected to the data line DN is lowered to the L level, while the voltage of the first bit line 114 connected to the data line DT is raised to the intermediate voltage HVDD. At this point, a node N01 coupled to the gate of the transistor T4 has the intermediate voltage HVDD, while a node N02 coupled to the source of the transistor T4 has a L-level voltage. In this case, there is a probability for the transistor T4 in the sense amplifier to be turned on. If the node N03 is a common node shared by the other sense amplifiers, the voltage level of the common node is reduced, and unselected sense amplifiers before being activated may start amplification operation involuntarily. The transistor T5 provided to every sense amplifier as shown in FIG. 16 can reduce the possibility of erroneous activation of the sense amplifiers.

Figure 17:
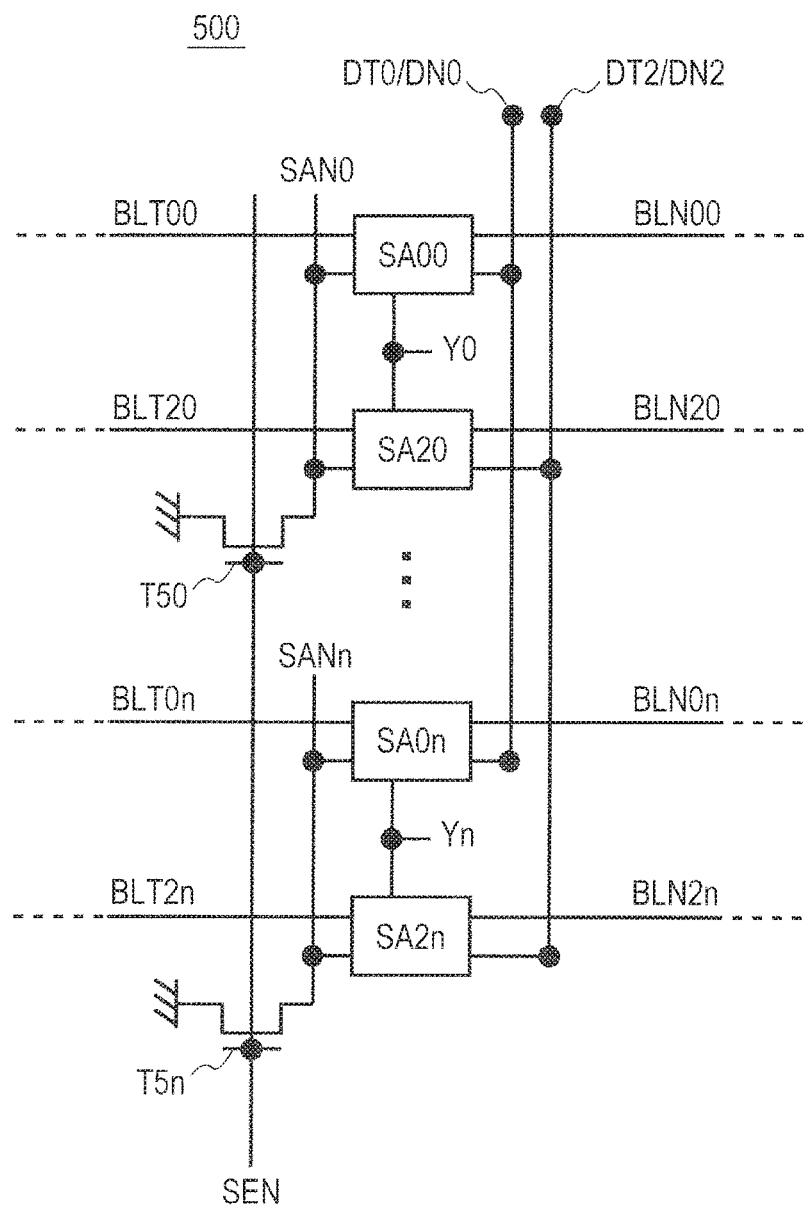
FIG. 17 is a circuit diagram of sense amplifiers and their peripheries in the semiconductor device according to the fifth embodiment.

FIG. 17 is a circuit diagram of the periphery of memory cells in the semiconductor device according to the fifth embodiment. The semiconductor device 500 according to the fifth embodiment includes a node SAN0 coupling a sense amplifier SA00 and a sense amplifier SA20, and a transistor T50 between the node SAN0 and a ground voltage. Likewise, the semiconductor device 500 includes a node SANn coupling a sense amplifier SA0n and a sense amplifier SA2n, and a transistor T5n between the node SANn and a ground voltage. In short, the semiconductor device 500 according to the fifth embodiment has common nodes separately provided for a plurality of sense amplifiers coupled to a common column selection signal, and has switch elements each provided between one of the common nodes and a ground voltage.

According to the above-described configuration, the transistor T5n can prevent current from sneaking into the sense amplifiers on unselected columns when columns are selected sequentially. Thus, the semiconductor device 500 according to the fifth embodiment can prevent erroneous activation of the sense amplifiers.

Sixth Embodiment

Next, the sixth embodiment will be described. The semiconductor device according to the sixth embodiment is different from the semiconductor device 100 according to the first embodiment in voltage on the data line pairs 140 and voltage of the column selection signals.

The configuration of the sub-array 116 shown in FIG. 3 is applied to the semiconductor device according to the sixth embodiment. As described with reference to FIG. 3, the second bit lines 115 are adjacent to bit lines corresponding to unselected columns. On the contrary, the first bit lines corresponding to selected columns are adjacent to each other. For instance, the second bit lines 115 (bit line BLN00 and bit line BLN20) associated with a column selection signal Y0 are adjacent to bit lines 117 corresponding to unselected columns. The bit lines 117 corresponding to the unselected columns are precharged to an intermediate voltage HVDD. Out of the first bit lines 114 corresponding to the selected columns, for example, a bit line BLT00 and bit line BLT10 are adjacent to each other. According to the configuration, the second bit lines 115 are less subjected to noise from the adjacent signal lines than the first bit lines 114.

Figure 18:
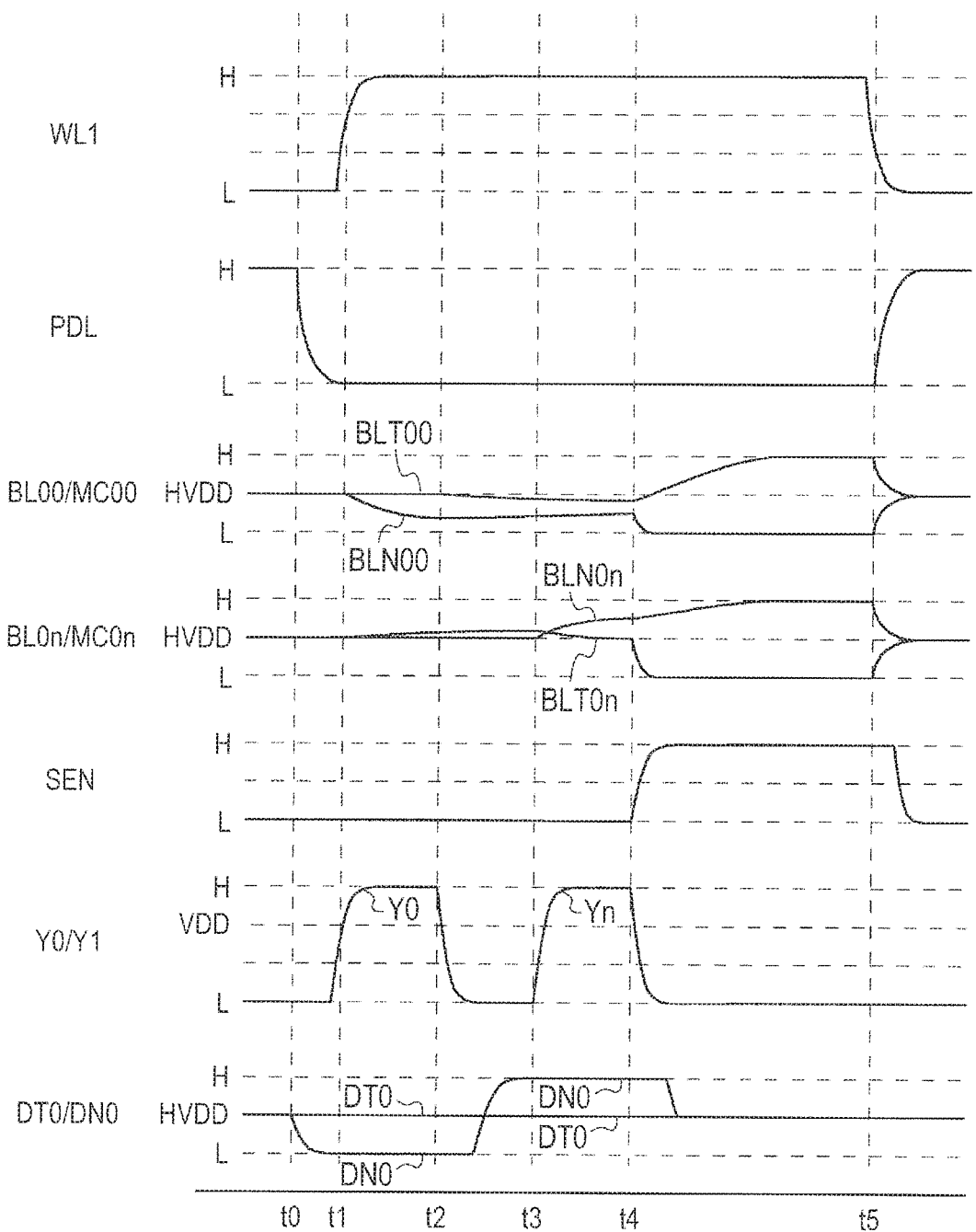
FIG. 18 is a timing diagram when a semiconductor device according to the sixth embodiment writes data.

Next, with reference to FIG. 18, processing performed by the semiconductor device according to the sixth embodiment will be described. FIG. 18 is a timing diagram when the semiconductor device according to the sixth embodiment writes data. In the same manner as the example shown in FIG. 4, FIG. 18 shows a case where a single word line 112 activates two memory cells (MC00 and MC0n) for the purpose of simplifying the description. The memory cell MC00 is associated with a BLT00 corresponding to the first bit line 114 and a BLN00 corresponding to the second bit line 115. The memory cell MC0n is associated with a BLT0n corresponding to the first bit line 114 and a BLN0n corresponding to the second bit line 115. The column selection signal Y0 is associated with the pair of bit lines BL00. The column selection signal Yn is associated with the pair of bit lines BL0n.

The example in FIG. 18 shows a write operation to write data "1" into the memory cell MC00 storing data "0", in other words, an operation to change the voltage of the capacitor in the memory cell MC00 from an L level to an H level. The example in FIG. 18 also shows a write operation to write data "0" into the memory cell MC0n storing data "1", in other words, an operation to change the voltage of the capacitor in the memory cell MC0n from an H level to an L level.

First, before Time t0, the pairs of bit lines BL00 and BL0n in the initial state are precharged by a precharge circuit 180 to an intermediate voltage HVDD. The voltage of the word line WL1 is at the L level. Since an enable signal SEN for sense amplifiers is at the L level, the sense amplifiers 130 are not activated. Both the column selection signals Y0 and Y1 are at the L level. This means that the data line pair 140 and the pairs of bit lines BL00 and BL0n are all in a non-conductive state. Incidentally, both lines in the data line pair 140 are set to the intermediate voltage HVDD.

At Time t0, a precharge signal PDL makes a transition from the H level to the L level. This brings the bit lines BLT00, BLN00, BLT0n, and BLN0n into a floating state. The voltage level of the data line DT0 in the data line pair 140 is maintained at the intermediate voltage HVDD. The voltage level of the data line DN0 in the data line pair 140 is changed to the L level.

Then, at Time t1, the voltage of the word line WL1 is changed from the L level to the H level. Changing the voltage of the word line WL1 to the H level activates the memory cells MC00 and MC0n. In addition, the column selection signal Y0 makes a transition from the L level to the H level. The H-level column selection signal Y0 turns on the column selection gate of the memory cell MC00. In this embodiment, the H level of the column selection signals Y0 and Yn is set higher than the supply voltage VDD. For instance, a voltage booster circuit is used to output the column selection signals Y0 and Yn having a higher voltage than the supply voltage VDD. This configuration allows N-type MOSFETs in the gate selection circuits to transfer signals at the supply voltage VDD.

The column selection gate of the memory cell MC00 in the on state connects the data line DT0 to the bit line BLT00. Simultaneously, the data line DN0 is connected to the bit line BLN00. When the bit line BLN00 at the intermediate voltage HVDD is connected to the L-level data line DN0, the voltage of the bit line BLN00 gradually decreases due to charge sharing. On the other hand, the bit line BLT00 at the intermediate voltage HVDD is connected to the data line DT0 at the intermediate voltage HVDD.

In addition, changing the voltage of the word line WL1 to the H level activates the memory cell MC0n. At this point, the memory cell MC0n has an H-level voltage corresponding to data "1", while the bit line BLT0n has the intermediate voltage HVDD. Therefore, the voltage of the bit line BLT0n coupled to the memory cell MC0n gradually increases due to charge sharing.

Next, at Time t2, the voltage of the bit line BLN00 is lower than a preset value. Then, the column selection signal Y0 is changed from the H level to the L level. Changing the column selection signal Y0 to the L level disconnects the bit line BLN00 from the data line DN0. That is, the voltage of the bit line BLN00 stops dropping and is maintained as it is. In addition, changing the column selection signal Y0 to the L level disconnects the bit line BLT00 from the data line DT0. At this point, the memory cell MC00 coupled to the bit line BLT00 has an L-level voltage corresponding to data "0". Therefore, the voltage of the bit line BLT00 starts decreasing gradually due to charge sharing.

Between Time t2 and Time t3, the voltage of the data line DN0 is changed from the L level to the H level. In the data line pair according to this embodiment, the voltage of the data line DT0 to be connected to the first bit line 114 is maintained at the intermediate voltage HVDD, the voltage of the data line DN0 to be connected to the second bit line 115 is switched to the H level or L level. To write "0" into the memory cell, the data line DN0 is set to the H level. To write "1" into the memory cell, on the other hand, the data line DN0 is set to the L level. Specifically, the data line pair according to this embodiment is configured to transfer voltage so as to maintain the voltage of the first bit line 114 at the precharged voltage of the pair of bit lines 113, and to charge the second bit line 115 to a potential higher or lower than the precharge voltage of the pair of bit lines 113. Thus, the pair of bit lines according to the embodiment maintains the voltage of the first bit line 114 at the intermediate voltage HVDD corresponding to the precharge voltage. On the other hand, the pair of bit lines according to the embodiment supplies an H-level voltage or an L-level voltage to the second bit line 115, which is less subject to noise than the first bit line 114. The semiconductor device according to the embodiment performs a write operation on memory cells as described above.

Next, at Time t3, the column selection signal Yn makes a transition from the L level to the H level. The H-level column selection signal Yn turns on the column selection gate of the memory cell MC0n. Therefore, the data line DT0 is connected to the bit line BLT0n, and the data line DN0 is concurrently connected to the bit line BLN0n. This connection with the data line DT0 decreases the voltage of the bit line BLT0n, which has been gradually increased from the intermediate voltage HVDD, to the intermediate voltage HVDD. On the other hand, the voltage of the bit line BLN0n is increased through the connection with the data line DN0 having the H-level voltage.

Next, at Time t4, the voltage of the bit line BLT0n is lower than a preset value. Then, the column selection signal Yn makes a transition from the H level to the L level. The L-level column selection signal Yn disconnects the bit line BLT0n from the data line DT0. The H-level voltage of the data line DN0 changes to the intermediate voltage HVDD after the column selection signal Yn is changed to the L level.

Also, at Time t4, the enable signal SEN for the sense amplifiers makes a transition from the L level to the H level. The H-level enable signal SEN activates the sense amplifiers 130. Specifically, the sense amplifier 130 associated with the memory cell MC00 amplifies the potential difference between the bit line BLT00 and bit line BLN00. This brings the memory cell MC00 into the H level. Therefore, data "0" in the memory cell MC00 is overwritten with data "1". At the same time, the sense amplifier 130 associated with the memory cell MC0n amplifies the potential difference between the bit line BLN0n and bit line BLN0n. This brings the memory cell MC0n into the L level. Therefore, data "1" in the memory cell MC0n is overwritten with data "0".

By means of the above-described configuration, the semiconductor device according to the sixth embodiment can operate stably at improved write speeds without an increase in area.

While the invention made by the present inventors has been described concretely with reference to the foregoing embodiments, it goes without saying that the present invention is not limited to the embodiments and that various modifications can be made without departing from the gist of the invention.

What is claimed is:

1. A semiconductor device comprising:
   a plurality of memory cells arranged in a matrix of rows and columns;
   a plurality of word lines provided to each row of the memory cells;
   a plurality of pairs of bit lines provided to each column of the memory cells;
   a plurality of sense amplifiers, each of the sense amplifiers configured to amplify a potential difference between a corresponding one of pairs of bit lines;
   a plurality of data line pairs configured to transfer data to the pairs of bit lines;
   a plurality of column selection circuits configured to permit receiving the data from the data line pairs;
   a column decoder configured to transmit column selection signals to the column selection circuits;
   a sense amplifier control circuit configured to activate the sense amplifiers after the column decoder transmits the column selection signals to the column selection circuits;

a sub-array including the plurality of the memory cells and the plurality of the sense amplifiers;

a memory cell array including a plurality of the sub-arrays;

a refresh control circuit that performs a refresh operation on at least one of the sub-arrays after the sense amplifiers are activated in a write operation;

a dummy mat that has the same configuration as the sub-array, and copies data of one of the sub-arrays that underwent a read operation in the past and stores the data;

a tag register that temporarily stores an address signal associated with the copied data as a past address signal;

a determination circuit that determines whether a request address signal, which is currently requested to perform a read operation, is included in the past address signals stored in the tag register; and a dummy memory control circuit that when the determination circuit determines that the request address signal is included in the past address signals, reads out the data associated with the request address signal from the dummy mat, wherein the refresh control circuit performs a refresh operation on the sub-array while the data is being read out from the dummy mat.

2. The semiconductor device according to claim 1, further comprising a timing control circuit that controls the time at which the column decoder completes transmission of the column selection signals, and the time at which the sense amplifier control circuit activates the sense amplifiers.

3. The semiconductor device according to claim 2, wherein the timing control circuit controls the column decoder to output the column selection signals involved in burst processing, and wherein the timing control circuit controls the sense amplifier control circuit to activate the sense amplifiers after the output of the column selection signals for the burst processing is completed.

4. The semiconductor device according to claim 1, wherein the data line pairs transfer to the bit line pairs a potential equal to or lower than a precharge potential of the bit line pairs.

5. The semiconductor device according to claim 1, wherein, before the voltage of the bit line pairs connected to the data line pairs becomes the same as the voltage of the data line pairs, the column decoder switches over the output of the column selection signals.

6. The semiconductor device according to claim 1 comprising a plurality of sub-arrays each including a plurality of the memory cells and a plurality of the sense amplifiers arranged, and the sense amplifier control circuit coupled to the sense amplifiers.

7. The semiconductor device according to claim 1, wherein the column decoder outputs one of the column selection signals to the bit line pairs.

8. The semiconductor device according to claim 1, wherein each of the bit line pairs is composed of bit lines, and one of the bit lines, which transfers the data to the associated memory cell, is coupled to 32 or more of the memory cells.

9. The semiconductor device according to claim 1 further comprising:

a data buffer that temporarily stores data to be write in a write operation;

an address buffer that temporarily stores an address signal for the memory cell associated with the data stored in the data buffer; and a command control circuit that controls the write operation and a read operation of the data, wherein the command control circuit outputs the data to be write in the write operation and the address signal for the memory cell associated with the data after a preset delay.

10. The semiconductor device according to claim 1, wherein each of the sense amplifiers further includes a switch element between supply voltage terminals to switch between activation and deactivation.

11. The semiconductor device according to claim 10, wherein the sense amplifiers include common nodes each provided for a plurality of the sense amplifiers coupled to a common column selection signal, and wherein the switch element is provided between the common node and a ground voltage.

12. The semiconductor device according to claim 1, wherein each of the bit line pairs includes a first bit line that transfers the data to the associated memory cell, and a second bit line that is used to compare potential difference with the first bit line, and wherein the second bit line is adjacent to a bit line corresponding to an unselected column.

13. The semiconductor device according to claim 12, wherein the data line pairs maintain the voltage of the first bit lines at the precharge voltage of the bit line pairs, and wherein the data line pairs transfer to the second bit lines a potential either higher or lower than the precharge potential of the bit line pairs.

14. The semiconductor device according to claim 1, wherein the semiconductor device is a dynamic random access memory.

* * * * *